(12) United States Patent
Zhang et al.

(10) Patent No.: US 11,832,492 B2
(45) Date of Patent: Nov. 28, 2023

(54) DISPLAY PANEL AND DISPLAY CONTROL METHOD, AND DISPLAY DEVICE

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventors: Mengmeng Zhang, Shanghai (CN); Lilian Kuang, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 339 days.

(21) Appl. No.: 17/203,430

(22) Filed: Mar. 16, 2021

(65) Prior Publication Data

US 2022/0208874 A1    Jun. 30, 2022

(30) Foreign Application Priority Data

Dec. 28, 2020   (CN) .......................... 202011585363.8

(51) Int. Cl.
| | | |
|---|---|---|
| *H01L 21/00* | (2006.01) | |
| *H10K 59/35* | (2023.01) | |
| *H10K 59/121* | (2023.01) | |
| *H10K 59/131* | (2023.01) | |

(52) U.S. Cl.
CPC ......... *H10K 59/353* (2023.02); *H10K 59/121* (2023.02); *H10K 59/131* (2023.02)

(58) Field of Classification Search
CPC .......................... H10K 59/131; H10K 59/353
See application file for complete search history.

(56) References Cited

U.S. PATENT DOCUMENTS

| | | | | |
|---|---|---|---|---|
| 2018/0108319 A1* | 4/2018 | Zuo | .................. | G02F 1/136286 |
| 2018/0174511 A1* | 6/2018 | Kim | ..................... | H10K 59/131 |
| 2019/0066622 A1* | 2/2019 | Lin | ....................... | G09G 3/3688 |
| 2021/0183283 A1* | 6/2021 | Park | ...................... | G09G 3/3266 |
| 2021/0193052 A1* | 6/2021 | Kim | ...................... | G09G 3/3275 |
| 2021/0201787 A1* | 7/2021 | Yuan | ..................... | G09G 3/3241 |
| 2021/0242295 A1* | 8/2021 | Luo | ...................... | H10K 59/121 |

FOREIGN PATENT DOCUMENTS

| | | |
|---|---|---|
| CN | 101398552 A | 4/2009 |
| CN | 104505016 A | 4/2015 |
| CN | 104933983 A | 9/2015 |
| CN | 110930938 A | 3/2020 |

* cited by examiner

*Primary Examiner* — Douglas M Menz
(74) *Attorney, Agent, or Firm* — Anova Law Group, PLLC

(57) ABSTRACT

A display panel, a display control method and a display device are provided. The display panel includes a display region and a non-display region, and a plurality of pixel units distributed in the display region in an array. Each pixel unit of the plurality of pixel units includes sub-pixels of at least three colors. The display panel also includes a control unit disposed in the non-display region and configured, in a first display mode, to control the sub-pixels of a same color of at least two pixel units of the plurality of pixel units to share a data signal.

15 Claims, 19 Drawing Sheets

In a first display mode, controlling sub-pixels of a same color in at least two pixel units to share a data signal, where the data signal may be a signal outputted once by a same data signal terminal of a driving chip of the display panel ⎯ S240

100  1000

DISPLAY PANEL AND DISPLAY CONTROL METHOD, AND DISPLAY DEVICE

CROSS-REFERENCE TO RELATED APPLICATION

This application claims the priority of Chinese patent application No. 202011585363.8, filed on Dec. 28, 2020, the entirety of which is incorporated herein by reference.

FIELD

The present disclosure generally relates to the field of display technology and, more particularly, relates to a display panel, a display control method of the display panel, and a display device.

BACKGROUND

An organic light-emitting diode (OLED) is one of the hot spots in the current display research field. Compared with a liquid-crystal display (LCD), the OLED display panel is featured with advantages such as low power consumption, low production cost, self-illumination, wide viewing angle, and fast response speed, etc.

With the development of display technology, the OLED display panel has been developed towards substantially low power consumption. Therefore, how to make the display panel have substantially low power consumption is an urgent technical problem that needs to be solved.

SUMMARY

One aspect of the present disclosure provides a display panel. The display panel includes a display region and a non-display region, and a plurality of pixel units distributed in the display region in an array. Each pixel unit of the plurality of pixel units includes sub-pixels of at least three colors. The display panel also includes a control unit disposed in the non-display region and configured, in a first display mode, to control the sub-pixels of a same color of at least two pixel units of the plurality of pixel units to share a data signal.

Another aspect of the present disclosure provides a display control method of a display panel, configured to control a display of the display panel. The display control method includes providing the display panel including a plurality of pixel units. Each pixel unit of the plurality of pixel units includes sub-pixels of at least three colors. The display control method also includes in a first display mode, controlling the sub-pixels of a same color of at least two pixel units of the plurality of pixel units to share a data signal. The data signal is a signal outputted once by a same data signal terminal of a driving chip of the display panel.

Another aspect of the present disclosure provides a display device. The display device includes a display panel. The display panel includes a display region and a non-display region, and a plurality of pixel units distributed in the display region in an array. Each pixel unit of the plurality of pixel units includes sub-pixels of at least three colors. The display panel also includes a control unit disposed in the non-display region and configured, in a first display mode, to control the sub-pixels of a same color of at least two pixel units of the plurality of pixel units to share a data signal.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

It should be noted that the relational terms such as target and non-target are merely used to distinguish one entity or operation from another entity or operation, and do not necessarily require or imply any such actual relationship or sequence between these entities or operations.

It should be understood that when describing the structure of a component, when a layer or a region is referred to as being "on" or "above" another layer or another region, the layer or the region may be directly on the other layer or the other region, or other layers or regions may be contained between the layer or the region and the another layer or the another region. Further, when a component is turned over, the layer or the region may be "under" or "below" the another layer or the another region.

The present disclosure provides a display panel. The display panel may be an OLED display panel. The display panel in various disclosed embodiments may be presented in various forms, and certain examples may be described below.

Figure 1:
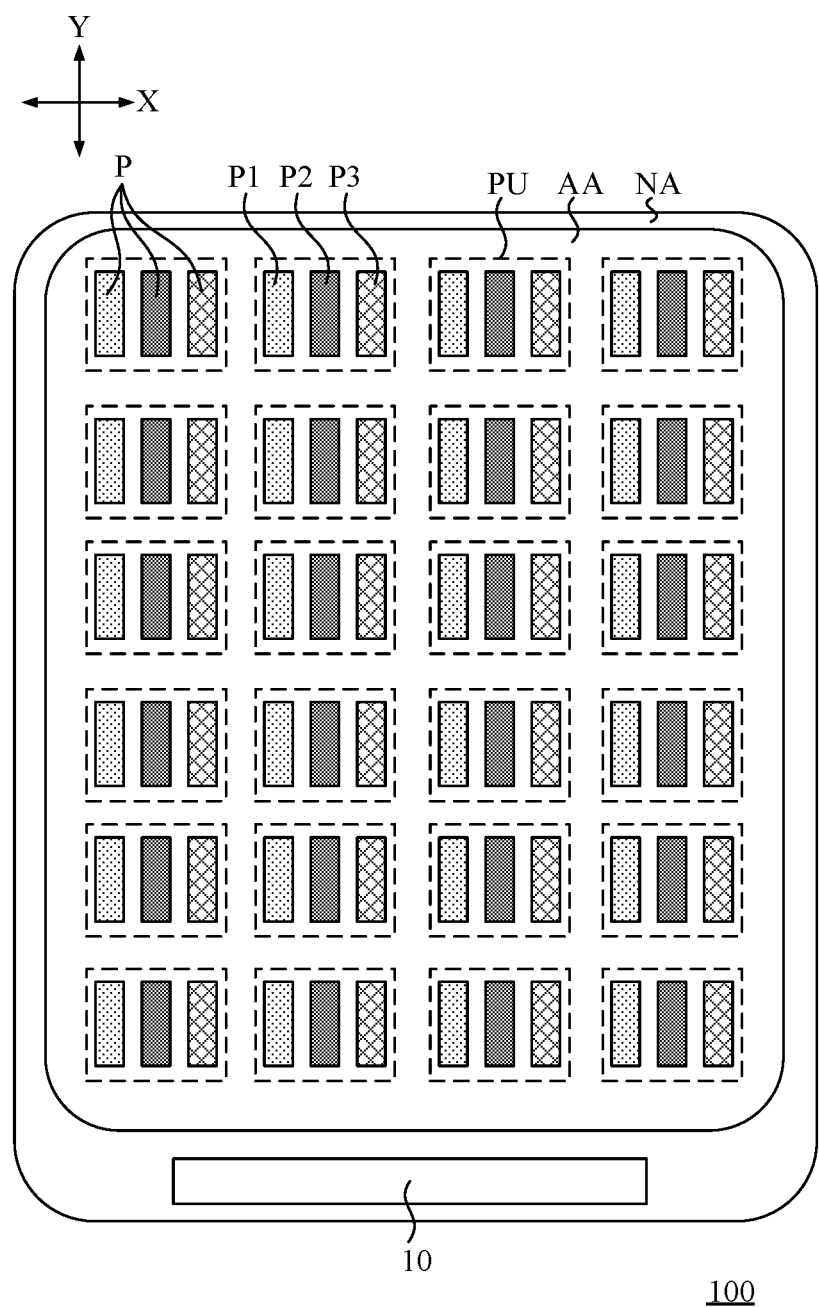
FIG. 1 illustrates a schematic top view of an exemplary display panel consistent with disclosed embodiments of the present disclosure.

FIG. 1 illustrates a schematic top view of a display panel consistent with disclosed embodiments of the present disclosure. Referring to FIG. 1, a display panel 100 may include a display region AA and a non-display region NA. The non-display region NA may be disposed at least partially surrounding the display region AA. The display region AA may have a circle shape, a rectangle shape, an ellipse shape, a rounded rectangle shape, or an irregular shape, etc., and the non-display region NA may have a shape compatible with the display region AA. For illustrative purposes, FIG. 1 illustrates the display region AA and the non-display region NA both having a rounded rectangle shape, which may not be limited by the present disclosure.

The display panel 100 may include a plurality of pixel units PU and a control unit 10. The plurality of pixel units PU may be distributed in the display region AA in an array. The control unit 10 may be disposed in the non-display region NA. Each pixel unit PU may include sub-pixels P of at least three colors. For example, each pixel unit PU may include sub-pixels P of at least three colors, namely a first sub-pixel P1, a second sub-pixel P2, and a third sub-pixel P3. The first sub-pixel P1 may be a red sub-pixel, the second sub-pixel P2 may be a green sub-pixel, and the third sub-pixel P3 may be a blue sub-pixel.

The control unit 10 may be configured, in a first display mode, to control the sub-pixels P of a same color in at least two pixel units PU to share a data signal. In one embodiment, the first display mode may be any one of a low power consumption display mode, a low refresh rate display mode, a low resolution display mode, or a standby screen display mode. In one embodiment, a refresh rate of the first display mode may be less than or equal to 30 Hz. In one embodiment, the data signal shared by sub-pixels of the same color may be a signal outputted once from a same data signal terminal of a driving chip of the display panel.

In the disclosed embodiments, because in the first display mode, the control unit 10 controls the sub-pixels P of the same color in at least two pixel units PU to share the data signal, the driving chip of the display panel may merely need to provide the data signal once for the sub-pixels that shares the data signal, which may reduce a quantity of data signals outputted by the driving chip, and may reduce the power consumption of the driving chip of the display panel, thereby reducing the power consumption of the display panel.

In one embodiment, the control unit 10 may be integrated on the driving chip of the display panel. In one embodiment, the control unit 10 may control the sub-pixels of a same color in two pixel units PU located in a same column and different rows to share the data signal, or may control the sub-pixels of a same color in two pixel units PU located in a same row and different columns to share the data signal, which may not be limited by the present disclosure.

In certain embodiments, the control unit 10 may be specifically configured, in the first display mode, to control the sub-pixels of a same color in at least two adjacent pixel units to share the data signal. For example, the control unit 10 may control the sub-pixels of the same color in the pixel units PU located in adjacent two rows of a same column to share the data signal, or may control sub-pixels of the same color in the pixel units PU located in adjacent two columns of a same row to share the data signal, which may not be limited by the present disclosure.

It should be understood that a plurality of sub-pixels of the same color sharing the data signal may display the same picture information. The sub-pixels of the same color in adjacent pixel units may be controlled to share the data signal, which may avoid the plurality of sub-pixels of the same color displaying the same picture information to be too scattered, thereby avoiding poor display quality of the display panel.

The plurality of pixel units PU may be distributed in M rows and N columns, where M may be an integer greater than or equal to two, and N may be an integer greater than or equal to two. For illustrative purposes, each pixel unit PU may include a first sub-pixel P1, a second sub-pixel P2, and a third sub-pixel P3 of different colors as an example. It should be understood that the first sub-pixels P1, the second sub-pixels P2, and the third sub-pixels P3 may also be distributed in M rows and N columns.

In certain embodiments, the control unit 10 may be configured, in the first display mode, to control the sub-pixels of a same color of pixel units in the $i^{th}$ row and $i+1^{th}$ row of a same column to share the data signal, where "i" may be an odd number and $1 \le i \le M$. In other words, the control unit 10 may be configured to control the sub-pixels of a same color of pixel units in an even row and previous odd row of a same column to share one data signal. For example, the control unit 10 may be configured, in the first display mode, to control the two first sub-pixels P1 in a first row and a second row of a first column to share one data signal, control the two second sub-pixels P2 in the first row and the second row of the first column to share one data signal, control the two third sub-pixels P3 in the first row and the second row of the first column to share one data signal, control the two first sub-pixels P1 in a third row and a fourth row of a first column to share one data signal, control the two second sub-pixels P2 in the third row and the fourth row of the first column to share one data signal, control the two third sub-pixels P3 in the third row and the fourth row of the first column to share one data signal, and so on.

For example, M may be an even number. Because the control unit 10 controls the sub-pixels of a same color of pixel units in an even row and previous odd row of a same column to share one data signal, the driving chip may merely need to output data signals corresponding to half of the pixel units, which may further reduce the quantity of data signals outputted by the driving chip.

In certain embodiments, the control unit 10 may be configured, in the first display mode, to control the sub-pixels of a same color of pixel units in the $j^{th}$ column and $j+1^{th}$ column of a same row to share one data signal, where "j" may be an odd number and $1 \le j \le N$. In other words, the control unit 10 may be configured to control the sub-pixels of a same color of pixel units in an even column and previous odd column of a same row to share one data signal. For example, the control unit 10 may be configured, in the first display mode, to control the two first sub-pixels P1 in a first column and a second column of a first row to share one data signal, control the two second sub-pixels P2 in the first column and the second column of the first row to share one data signal, control the two third sub-pixels P3 in the first column and the second column of the first row to share one data signal, control the two first sub-pixels P1 in a third column and a fourth column of a first row to share one data signal, control the two second sub-pixels P2 in the third column and the fourth column of the first row to share one data signal, control the two third sub-pixels P3 in the third column and the fourth column of the first row to share one data signal, and so on.

For example, N may be an even number. Because the control unit 10 controls the sub-pixels of a same color of pixel units in an even column and previous odd column of a same row to share one data signal, the driving chip may merely need to output data signals corresponding to half of the pixel units, which may further reduce the quantity of data signals outputted by the driving chip.

In certain embodiments, the control unit 10 may be configured, in the first display mode, to control the sub-pixels of a same color of pixel units in the $i^{th}$ row and $i+1^{th}$ row of a same column to share one data signal, and control the sub-pixels of the same color of pixel units in the $j^{th}$ column and $j+1^{th}$ column of a same row to share the one data signal. In other words, the control unit 10 may be configured to control the sub-pixels of a same color of four pixel units arranged in adjacent two rows and adjacent two columns to share one data signal.

For example, the control unit 10 may be configured, in the first display mode, to control the four first sub-pixels P1 in a first column and a second column of a first row and in a first column and a second column of a second row to share one data signal, control the four second sub-pixels P2 in the first column and the second column of the first row and in the first column and the second column of the second row to share one data signal, control the four third sub-pixels P3 in the first column and the second column of the first row and in the first column and the second column of the second row to share one data signal, control the four first sub-pixels P1 in a first column and a second column of a third row and in a first column and a second column of a fourth row to share one data signal, control the four second sub-pixels P2 in the first column and the second column of the third row and in the first column and the second column of the fourth row to share one data signal, control the four third sub-pixels P3 in the first column and the second column of the third row and in the first column and the second column of the fourth row to share one data signal, and so on.

For example, both M and N may be an even number. Because the control unit 10 controls the sub-pixels of a same color of four pixel units to share one data signal, the driving chip may merely need to output data signals corresponding to 25% of the pixel units, which may further reduce the quantity of data signals outputted by the driving chip.

Figure 2:
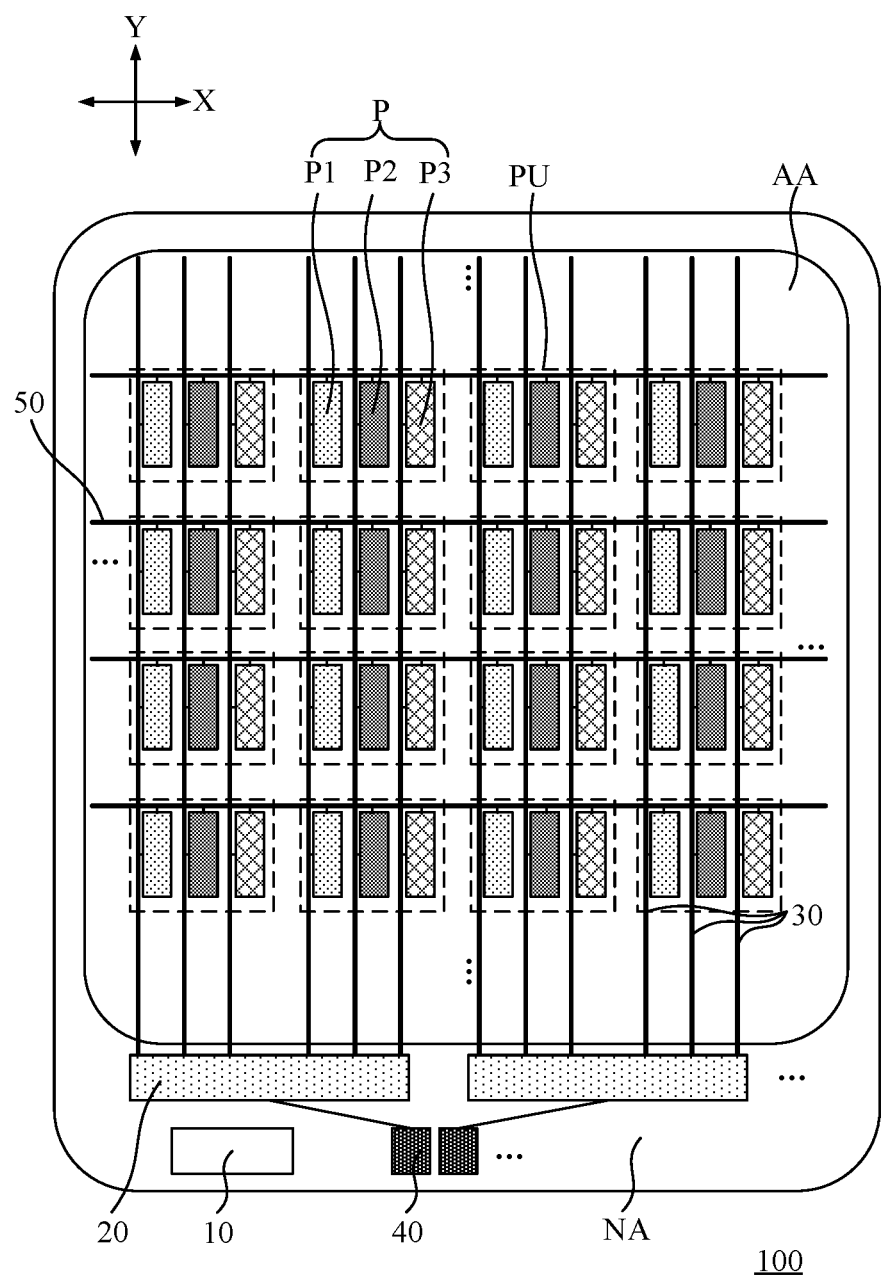
FIG. 2 illustrates a schematic top view of another exemplary display panel consistent with disclosed embodiments of the present disclosure.
Figure 3:
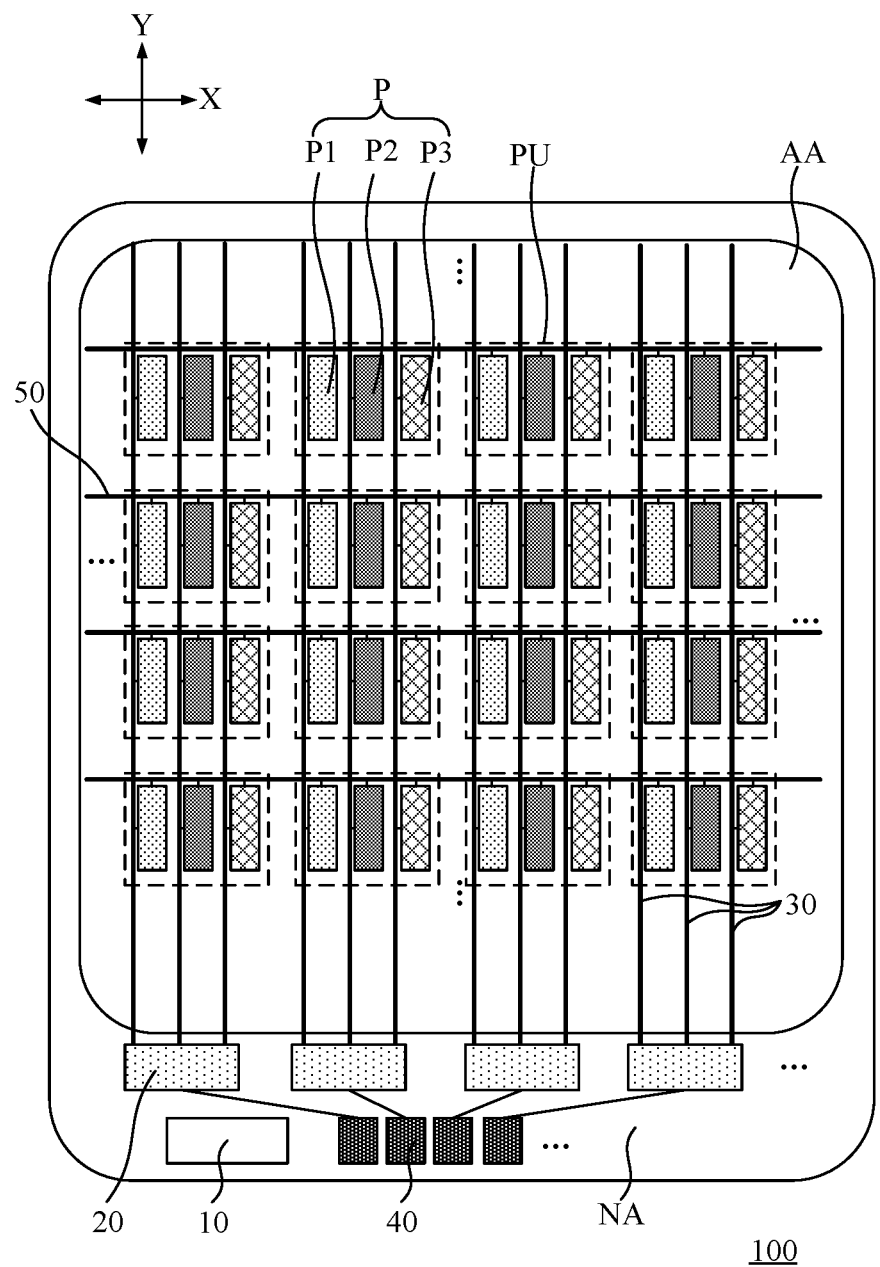
FIG. 3 illustrates a schematic top view of another exemplary display panel consistent with disclosed embodiments of the present disclosure.

FIG. 2 and FIG. 3 illustrate part of the pixel units PU. In certain embodiments, referring to FIG. 2 and FIG. 3, the display panel 100 may include a plurality of multi-channel multiplexers 20, a plurality of data lines 30 and a plurality of data signal terminals 40. The plurality of multi-channel multiplexers 20 and the plurality of data signal terminals 40 may be disposed in the non-display region NA, and the plurality of data lines 30 may be extended along a column direction Y and may be spaced apart in a row direction X. The plurality of multi-channel multiplexers 20 may be electrically connected to the plurality of data signal terminals 40 in a one-to-one correspondence. Each multi-channel multiplexer 20 may be electrically connected to pixel units in at least one column PU through a data line 30, and the sub-pixels P of a same color of the pixel units PU in a same column may be electrically connected to a same data line 30. FIG. 2 illustrates that each multi-channel multiplexer 20 may be electrically connected to pixel units PU in two columns, and FIG. 3 illustrates that each multi-channel multiplexer 20 may be electrically connected to pixel units PU in one column.

In one embodiment, in the pixel units PU in a same column, sub-pixels of the same color may be electrically connected to a same data line 30, and sub-pixels of different colors may be electrically connected to different data lines 30.

In one embodiment, the data signal terminal 40 may be directly integrated on the driving chip of the display panel. In another embodiment, the data signal terminal 40 may be electrically connected to the driving chip of the display panel through a flexible printed circuit (FPC) board, which may not be limited by the present disclosure.

In certain embodiments, the control unit 10 may be specifically configured to: during a first period of the first display mode, control the multi-channel multiplexer 20 to be turned on, to transmit a data signal to the sub-pixels P of the pixel units PU in the $i^{th}$ row through the multi-channel multiplexer 20 and the data line 30; and during a second period of the first display mode, control the multi-channel multiplexer 20 to be turned off, to make the sub-pixels P of the pixel units PU in the $i+1^{th}$ row share the data signal stored on the data line 30 in the first period. The second period may be after the first period, and the first period and the second period may be in same frame.

In one embodiment, referring to FIG. 2 and FIG. 3, the pixel units PU in the $i^{th}$ row and the $i+1^{th}$ row may be used as an example. In the first period, the control unit 10 may control each multi-channel multiplexer 20 to be turned on, and the driving chip may output the data signal corresponding to the pixel units PU in the $i^{th}$ row. The data signal may sequentially pass the data signal terminal 40, the multi-channel multiplexer 20 and the data line 30, and may be transmitted to the pixel units PU in the $i^{th}$ row. Further, the data signal may be temporarily stored on the data line 30. In the second period, the control unit 10 may control each multi-channel multiplexer 20 to be turned off, and the driving chip may stop outputting the data signal. Because the data line 30 temporarily stores the data signal corresponding to the pixel units PU in the $i^{th}$ row, the pixel units PU in the $i+1^{th}$ row may share the data signal corresponding to the pixel units PU in the $i^{th}$ row temporarily stored on the data line 30.

In certain embodiments, the control unit 10 may be specifically configured, in the first display mode, to control the multi-channel multiplexers 20 electrically connected to the pixel units PU in a $j^{th}$ column and a $j+1^{th}$ column of a same row to be simultaneously turned on, such that the pixel units in the $j^{th}$ column and the $j+1^{th}$ column may share a data signal from a same data signal terminal 40. In other words, the multi-channel multiplexers 20 electrically connected to the pixel units PU in the $j^{th}$ column and the $j+1^{th}$ column may receive a same control signal, and may be simultaneously turned on. In view of this, the driving chip may merely output the data signal corresponding to pixel unit in the $j^{th}$ column, and may stop outputting the data signal corresponding to pixel units PU in the $j+1^{th}$ column. Alternatively, the driving chip may merely output the data signal corresponding to the $j+1^{th}$ column, and may stop outputting the data signal corresponding to pixel units PU in the $j^{th}$ column. Because the multi-channel multiplexers 20 electrically connected to the pixel units PU in the $j^{th}$ column and the $j+1^{th}$ column are turned on, the pixel units PU in the $j^{th}$ column and the $j+1^{th}$ column may share one data signal.

In certain embodiments, the control unit 10 may be specifically configured to during the first period of the first display mode, control the multi-channel multiplexer 20 to be turned on, to transmit a data signal to the sub-pixels P of the pixel units PU in the $i^{th}$ row through the multi-channel multiplexer 20 and the data line 30; during a second period of the first display mode, control the multi-channel multiplexer 20 to be turned off, to make the sub-pixels P of the pixel units PU in the $i+1^{th}$ row share the data signal stored on the data line 30 in the first period, and control the multi-channel multiplexers 20 electrically connected to the pixel units in a $j^{th}$ column and a $j+1^{th}$ column of a same row to be simultaneously turned on, to make the pixel units in the $j^{th}$ column and the $j+1^{th}$ column share a data signal from a same data signal terminal.

In one embodiment, the multi-channel multiplexer 20 may include a control terminal. The control unit 10 may be configured to control a level of the control signal provided to the control terminal of the multi-channel multiplexer 20, to control the multi-channel multiplexer 20 to be turned on or turned off.

In the present disclosure, by controlling the turned-on or turned-off state of the multi-channel multiplexer, the pixel units may be capable of sharing a data signal, thereby reducing the quantity of data signals outputted by the driving chip and reducing the power consumption of the driving chip.

Figure 4:
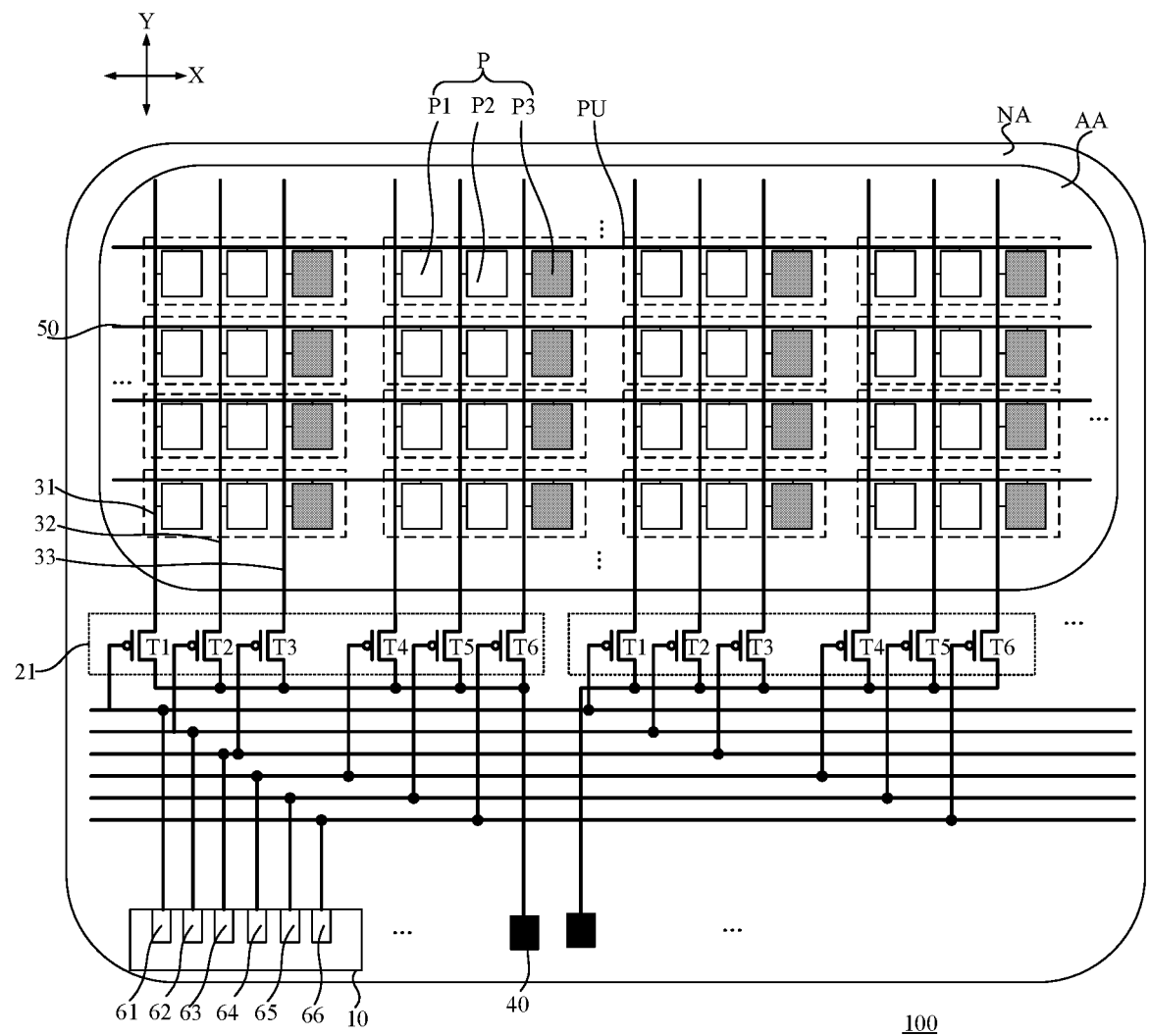
FIG. 4 illustrates a schematic top view of another exemplary display panel consistent with disclosed embodiments of the present disclosure.

In certain embodiments, referring to FIG. 4, one multi-channel multiplexer 20 may be electrically connected to corresponding pixel units PU in two columns. For example, the multi-channel multiplexer 20 may be electrically connected to the pixel units PU in the $j^{th}$ column and the $j+1^{th}$ column. Each pixel unit PU may include a first subpixel P1, a second subpixel P2, and a third subpixel P3. The data line 30 may include a first data line 31, a second data line 32, and a third data line 33. The first sub-pixel P1 may be connected to the first data line 31, the second sub-pixel P2 may be connected to the second data line 32, and the third sub-pixel P3 may be connected to the third data line 33. Each multi-channel multiplexer 20 may include a first transistor T1, a second transistor T2, a third transistor T3, a fourth transistor T4, a fifth transistor T5, and a sixth transistor T6.

First electrodes of the first transistor T1, the second transistor T2, the third transistor T3, the fourth transistor T4, the fifth transistor T5, and the sixth transistor T6 may be electrically connected to the data signal terminal 40. A gate of the first transistor T1 may be electrically connected to a first control signal terminal 61, a gate of the second transistor T2 may be electrically connected to a second control signal terminal 62, a gate of the third transistor T3 may be electrically connected to a third control signal terminal 63, a gate of the fourth transistor T4 may be electrically connected to a fourth control signal terminal 64, a gate of the fifth transistor T5 may be electrically connected to a fifth control signal terminal 65, and a gate of the sixth transistor T6 may be electrically connected to a sixth control signal terminal 66.

A second electrode of the first transistor T1 may be electrically connected to the first data line 31 corresponding to the pixel units PU in the $j^{th}$ column, a second electrode of the second transistor T2 may be electrically connected to the second data line 32 corresponding to the pixel units PU in the $j^{th}$ column, and a second electrode of the third transistor T3 may be electrically connected to the third data line 33 corresponding to the pixel units PU in the $j^{th}$ column. A second electrode of the fourth transistor T4 may be electrically connected to the first data line 31 corresponding to the pixel units PU in the $j+1^{th}$ column, a second electrode of the fifth transistor T5 may be electrically connected to the second data line 32 corresponding to the pixel units PU in the $j+1^{th}$ column, and a second electrode of the sixth transistor T6 may be electrically connected to the third data line 33 corresponding to the pixel units PU in the $j+1^{th}$ column.

In one embodiment, the control signal terminals 61-66 may be integrated on the control unit 10, and the control signal terminals 61-66 may output voltage signals.

Every transistor in the multi-channel multiplexer 20 may be a P-type transistor or an N-type transistor. Alternatively, part of the transistors in the multi-channel multiplexer 20 may be P-type transistors, and the other part of the transistors in the multi-channel multiplexer 20 may be N-type transistors. Further, a turned-on level of the P-type transistor may be a low level, and a turned-off level thereof may be a high level. A turned-on level of the N-type transistor may be a high level, and a turned-off level thereof may be a low level. The specific types of transistors in the multi-channel multiplexer 20 may not be limited by the present disclosure.

The control signals outputted by the control signal terminals 61-66 may be CKH1, CKH2, CKH3, CKH4, CKH5, CKH6, respectively. In one embodiment, the display panel may further include a scan line 50. The scan line 50 may be configured to transmit a scan signal SCAN to each sub-pixel P. For illustrative purposes, a low level of the scan signal SCAN may be the turned-on level, and a high level of the scan signal SCAN may be the turned-off level as an example. In addition, for illustrative purposed, each transistor in the multi-channel multiplexer 20 may be a P-type transistor as an example.

Figure 5:
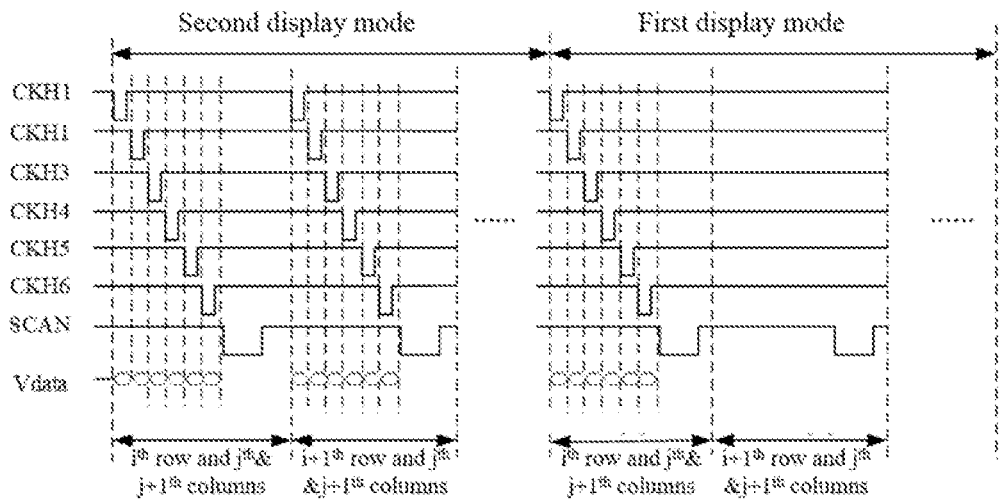
FIG. 5 illustrates an exemplary timing sequence diagram of a display panel in FIG. 4.

In certain embodiments, referring to FIG. 5, in the second display mode, for pixel units PU in each row, the control signal terminals 61-66 may output turned-on levels in sequence. For example, the control signals CKH1, CKH2, CKH3, CKH4, CKH5, and CKH6 corresponding to the pixel units PU in each row may be low levels in sequence, such that the transistors T1-T6 may be turned on in sequence. In one embodiment, the second display mode may be a high refresh rate display mode, or a high resolution display mode. In one embodiment, the refresh rate of the second display mode may be greater than 30 Hz. For example, the refresh rate of the second display mode may be 60 Hz. In the second display mode, for pixel units PU in each row, the control signal terminals 61-66 may output turned-on levels in sequence, which may prevent the pixel units from sharing a data signal and may avoid affecting the display quality of the display panel.

For illustrative purposes, a quantity of rows of the pixel units PU may be M, where M may be an integer and 1≤i≤M and "i" may be an odd number as an example. In the first display mode, the control unit 10 may control the control signals CKH1, CKH2, CKH3, CKH4, CKH5, CKH6 corresponding to the pixel units PU in the $j^{th}$ column and the $j+1^{th}$ column of $i^{th}$ row to be low levels in sequence, such that the transistors T1-T6 may be turned on in sequence, and the data signals Vdata sequentially outputted by the data signal terminals 40 may be transmitted to the data line 30. When the scan signal SCAN corresponding to the pixel units PU in the $i^{th}$ row is a low level, the data signal on the data line 30 may be written into the pixel units PU in the $i^{th}$ row.

The control unit 10 may control the control signals CKH1, CKH2, CKH3, CKH4, CKH5, and CKH6 corresponding to the pixel units PU in the $j^{th}$ column and the $j+1^{th}$ column of $i+1^{th}$ row to be a high-level, such that the transistors T1-T6 may be turned off. In view of this, the driving chip of the display panel may stop outputting the data signals corresponding to the pixel units PU in the $j^{th}$ column and the $j+1^{th}$ column of $i+1^{th}$ row. Because the data signal corresponding to the pixel units PU in the $i^{th}$ row is temporarily stored on the data line 30, when the scan signal SCAN corresponding to the pixel units PU in the $i+1^{th}$ row is a low level, the data signal corresponding to the pixel units PU in the $i^{th}$ row temporarily stored on the data line 30 may be written into the pixel units PU in the $i+1^{th}$ row. Therefore, the pixel units PU in the $i^{th}$ row and the pixel units PU in the $i+1^{th}$ row may share the data signal, and the driving chip of the display panel may merely need to provide the data signal corresponding to the pixel units PU in the $i^{th}$ row, thereby reducing the quantity of data signals outputted by the driving chip and reducing the power consumption of the driving chip of the display panel.

It should be understood that in the disclosed embodiments, although the data signal corresponding to the pixel units PU in the $i+1^{th}$ row is not provided, because the pixel units PU in the $i+1^{th}$ row share the data signal corresponding to the pixel units PU in the $i^{th}$ row, the pixel units PU in the $i+1^{th}$ row may also be lit, to prevent the obvious observable gap caused by non-lit pixel units PU in the $i+1^{th}$ row.

Figure 6:
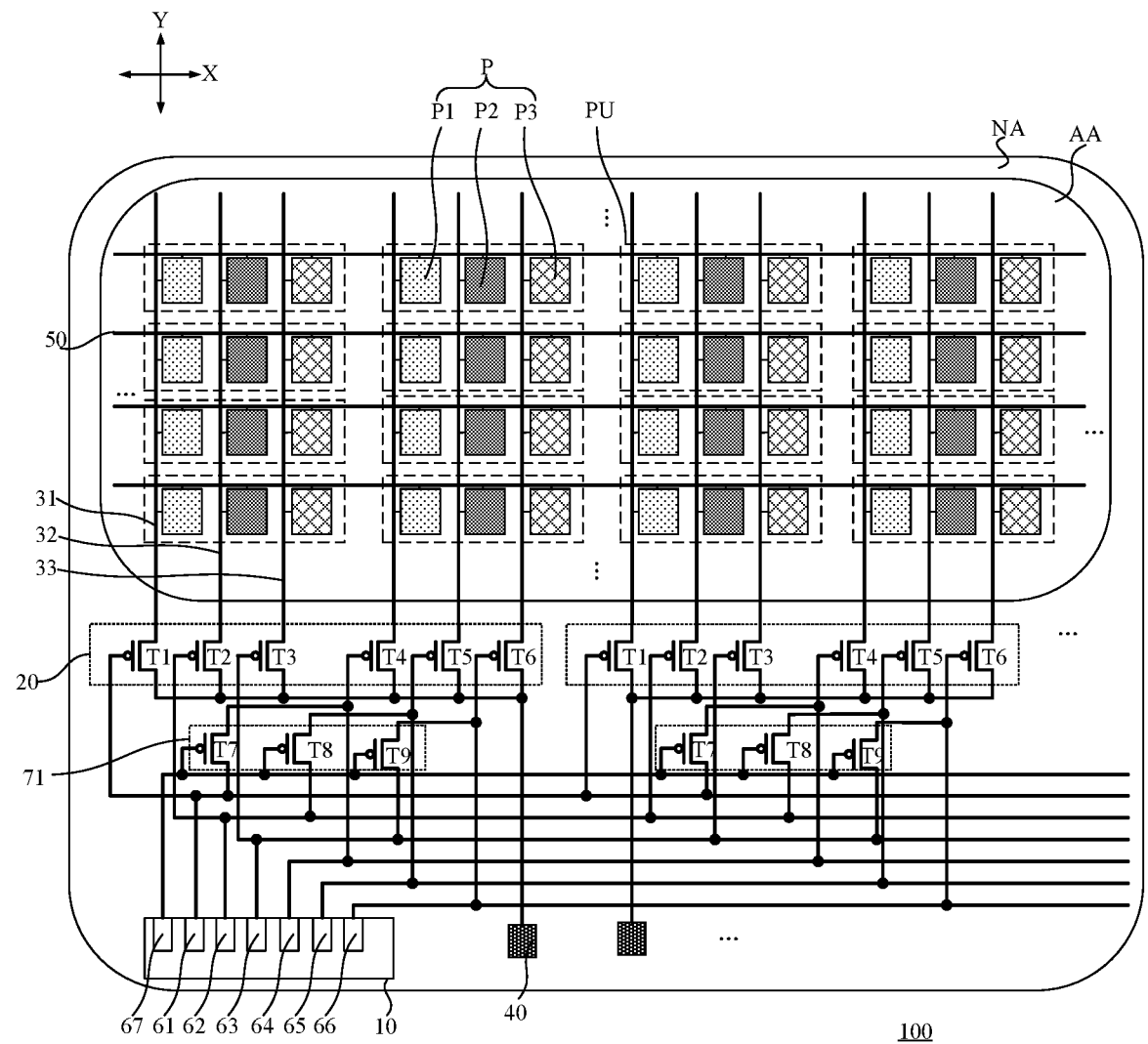
FIG. 6 illustrates a schematic top view of another exemplary display panel consistent with disclosed embodiments of the present disclosure.

In certain embodiments, referring to FIG. 6, the display panel 100 may further include a first switch unit 71. The first switch unit 71 may one-to-one correspond to the multi-channel multiplexer 20. The first switch unit 71 may include a seventh transistors T7, an eighth transistor T8, and a ninth transistor T9. Gates of the seventh transistor T7, the eighth transistor T8 and the ninth transistor T9 may be electrically connected to the seventh control signal terminal 67. A first electrode of the seventh transistor T7 may be electrically connected to the first control signal terminal 61, and a second electrode of the seventh transistor T7 may be electrically connected to the gate of the fourth transistor T4. A first electrode of the eighth transistor T8 may be electrically connected to the second control signal terminal 62, and a second electrode of the eighth transistor T8 may be electrically connected to the gate of the fifth transistor T5. A first electrode of the ninth transistor T9 may be electrically connected to the third control signal terminal 63, and a second electrode of the ninth transistor T9 may be electrically connected to the gate of the sixth transistor T6.

For illustrative purposes, the seventh control signal terminal 67 may also be integrated on the control unit 10.

Figure 7:
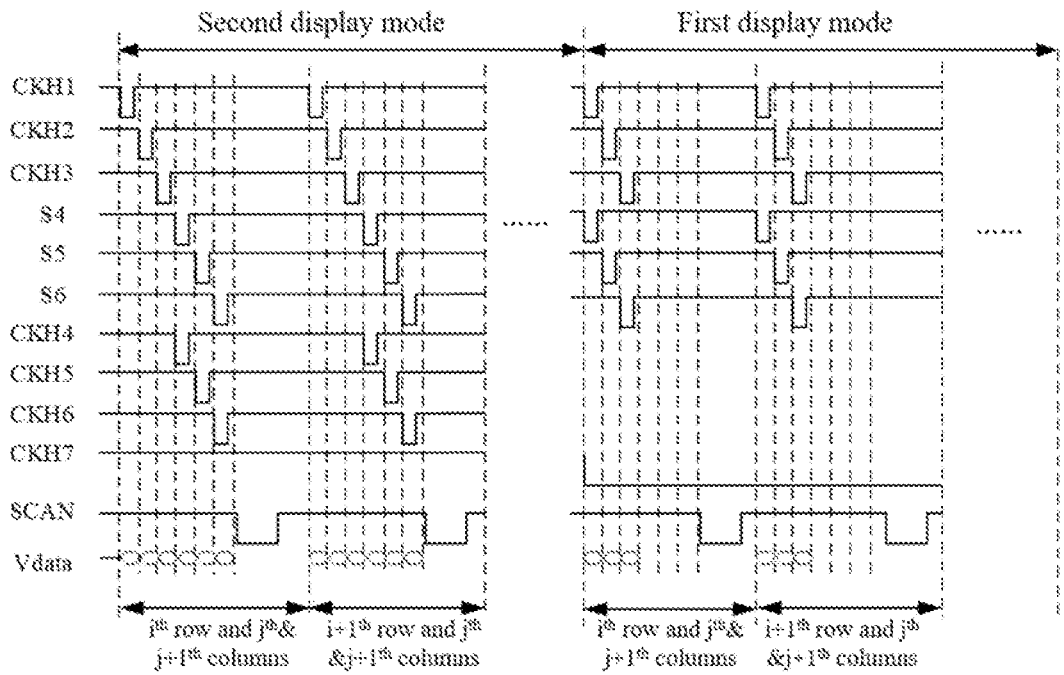
FIG. 7 illustrates an exemplary timing sequence diagram of a display panel in FIG. 6.

Referring to FIG. 7, S4, S5, and S6 in FIG. 7 may represent signals received by the gates of the fourth transistor T4, the fifth transistor T5, and the sixth transistor T6, respectively. In one embodiment, for illustrative purposes, the transistors T1-T9 may be P-type transistors as an example. The control signals CKH1, CKH2, CKH3, CKH4, CKH5, CKH6 corresponding to the second display mode shown in FIG. 7 may be the same as the control signals corresponding to the second display mode shown in FIG. 5. The control signal CKH7 outputted by the seventh control signal terminal 67 in the second display mode shown in FIG. 7 may be a high-level, such that the transistors T7-T9 may be turned off, thereby preventing the control signals CKH1, CKH2, CKH3 from being transmitted to the transistors T4-T6.

Referring to FIG. 7, in the first display mode, the control unit 10 may be specifically configured to control the first control signal terminal 61, the second control signal terminal 62, and the third control signal terminal 63 to output turned-on levels in sequence, control the seventh control signal terminal 67 to output the turned-on level, and control the fourth control signal terminal 64, the fifth control signal terminal 65 and the sixth control signal terminal 66 to stop outputting a control signal.

Because the seventh control signal terminal 67 outputs the turned-on level, the transistors T7-T9 may be turned on, and the turned-on levels sequentially outputted from the first control signal terminal 61, the second control signal terminal 62, and the third control signal terminal 63 may be transmitted to the gates of the transistors T4-T6 through the transistors T7-T9, respectively. Therefore, the signal S4 received by the gate of the fourth transistor T4 may be the same as the control signal CKH1 outputted from the first control signal terminal 61. The signal S5 received by the gate of the fifth transistor T5 may be the same as the control signal CKH2 outputted from the second control signal terminal 62. The signal S6 received by the gate of the sixth transistor T6 may be the same as the control signal CKH3 outputted from the third control signal terminal 63. Thus, the fourth transistor T4 and the first transistor T1 may be simultaneously turned on, the fifth transistor T5 and the second transistor T2 may be simultaneously turned on, and the sixth transistor T6 and the third transistor T3 may be simultaneously turned on.

When the fourth transistor T4 and the first transistor T1 are simultaneously turned on, the data signal Vdata corresponding to the first sub-pixels P1 of the pixel units PU in the $j^{th}$ column outputted by the data signal terminal 40 may simultaneously reach the first data line 31 corresponding to the pixel units PU in the $j^{th}$ column through the first transistor T1 and the first data line 31 corresponding to the pixel units PU in the j+1$^{th}$ column through the fourth transistor T4, such that the first sub-pixels P1 of the pixel units PU in the j$^{th}$ column and the j+1$^{th}$ column may share one data signal. Similarly, when the fifth transistor T5 and the second transistor T2 are simultaneously turned on, the second sub-pixels P2 of the pixel units PU in the j$^{th}$ column and the j+1$^{th}$ column may share the data signal corresponding to the second sub-pixels P2 of the pixel units PU in the j$^{th}$ column. When the sixth transistor T6 and the third transistor T3 are simultaneously turned on, the third sub-pixels P3 of the pixel units PU in the j$^{th}$ column and the j+1$^{th}$ column may share the data signal corresponding to the third sub-pixels P3 of the pixel units PU in the j$^{th}$ column. Therefore, the pixel units PU in the j$^{th}$ column and the pixel units PU in the j+1$^{th}$ column may share the data signal, the driving chip of the display panel may merely need to provide the data signal corresponding to the pixel units PU in the j$^{th}$ column, thereby reducing the quantity of data signals outputted by the driving chip and reducing the power consumption of the driving chip of the display panel.

It should be understood that in the disclosed embodiments, although the data signal corresponding to the pixel units PU in the j+1$^{th}$ column is not provided, because the pixel units PU in the j+1$^{th}$ column shares the data signal corresponding to the pixel units PU in the j$^{th}$ column, the pixel units PU in the j+1$^{th}$ column may also be lit, to prevent the obvious observable gap caused by non-lit pixel units PU in the j+1$^{th}$ column.

For example, referring to FIG. 7, merely the pixel units PU in the j$^{th}$ column and the j+1$^{th}$ column may share the data signal, and the pixel units PU in the i$^{th}$ row and the i+1$^{th}$ row may not share the data signal. Specifically, in the first display mode, the control unit 10 may control the control signals CKH1, CKH2, and CKH3 corresponding to the pixel units PU in the i$^{th}$ row and the i+1$^{th}$ row to be low levels in sequence, may control the control signal terminals 64-66 to stop outputting the control signal, may control the control signal CKH7 to be a low level, and may provide data signals respectively corresponding to the pixel units PU in the i$^{th}$ row and the i+1$^{th}$ row through the data signal terminal 40.

Figure 8:
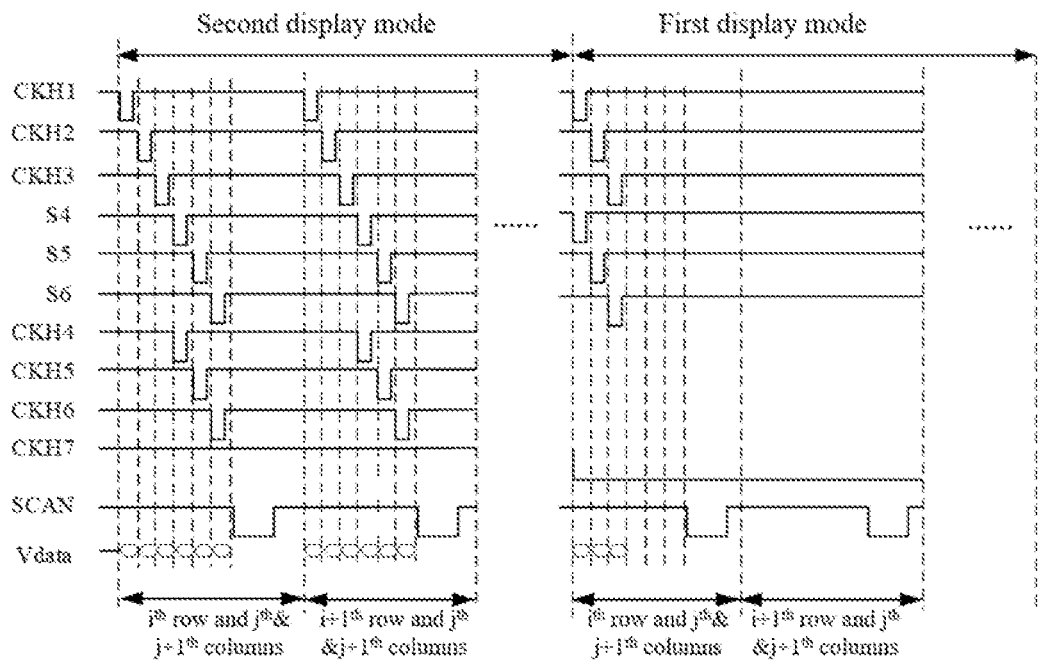
FIG. 8 illustrates another exemplary timing sequence diagram of a display panel in FIG. 6.

For another example, referring to FIG. 8, not only the pixel units PU in the j$^{th}$ column and the j+1$^{th}$ column may share the data signal, but also the pixel units PU in the i$^{th}$ row and the i+1$^{th}$ row may share the data signal. Specifically, in the first display mode, the control unit 10 may control the control signals CKH1, CKH2, and CKH3 corresponding to the pixel units PU in the i$^{th}$ row to be low levels in sequence, may control the control signals CKH1, CKH2, and CKH3 corresponding to the pixel units PU in the i+1$^{th}$ row to be a high-level, may control the control signal terminals 64-66 to stop outputting a control signal, may control the control signal CKH7 to be a low level, and may provide the data signal corresponding to the pixel unit in the i$^{th}$ row and the j$^{th}$ column through the data signal terminal 40, such that the four pixel units PU in the i$^{th}$ row and j$^{th}$ column, i$^{th}$ row and j+1$^{th}$ column, i+1$^{th}$ row and j$^{th}$ column, and i+1$^{th}$ row and j+1$^{th}$ column may share the data signal corresponding to the pixel unit in the i$^{th}$ row and the j$^{th}$ column.

Figure 9:
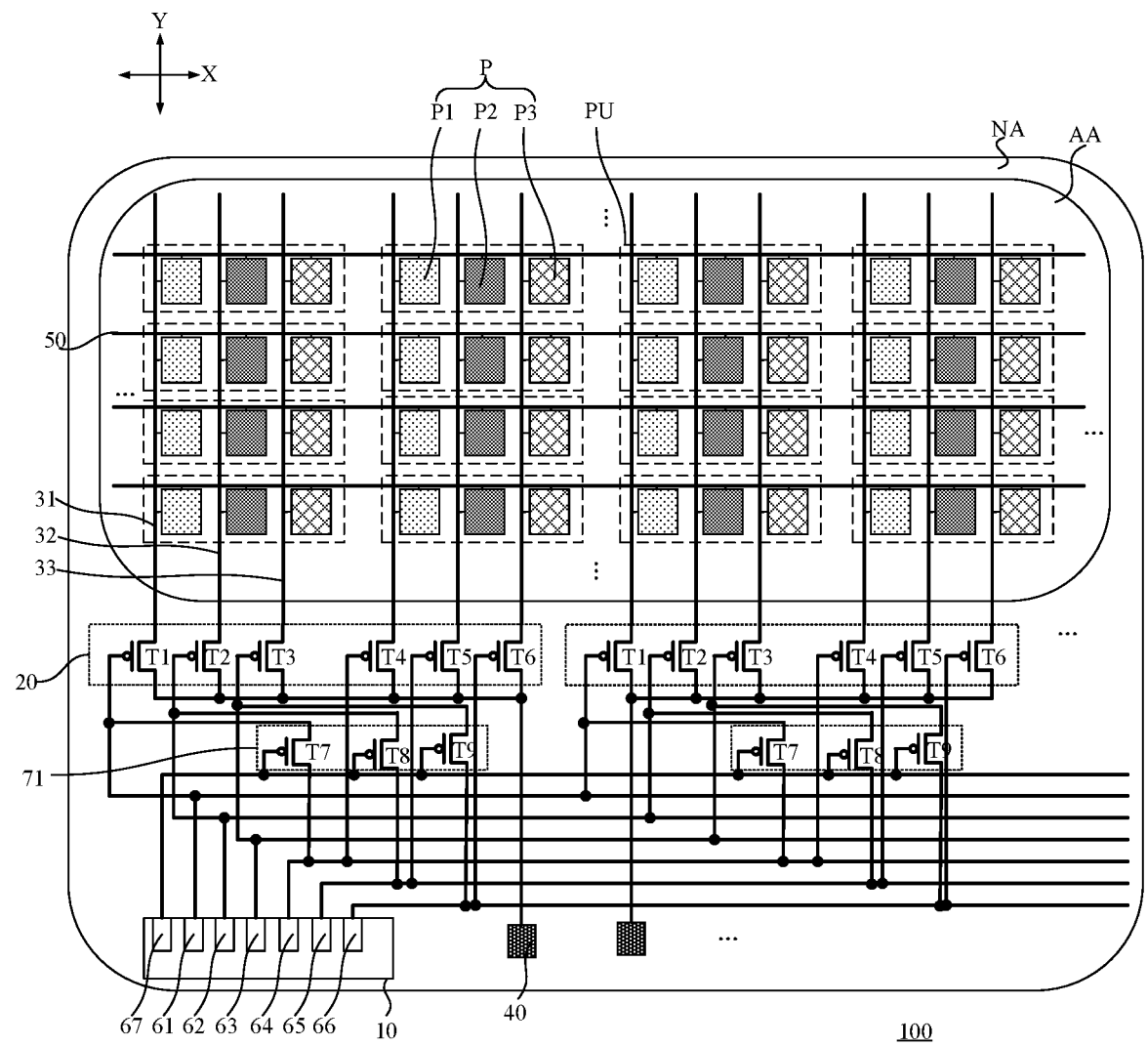
FIG. 9 illustrates a schematic top view of another exemplary display panel consistent with disclosed embodiments of the present disclosure.

In certain embodiments, referring to FIG. 9, the gates of the seventh transistor T7, the eighth transistor T8, and the ninth transistor T9 may be electrically connected to the seventh control signal terminal 67. A first electrode of the seventh transistor T7 may be electrically connected to the fourth control signal terminal 64, a second electrode of the seventh transistor T7 may be electrically connected to the gate of the first transistor T1. A first electrode of the eighth transistor T8 may be electrically connected to the fifth control signal terminal 65, and a second electrode of the eighth transistor T8 may be electrically connected to the gate of the second transistor T2. A first electrode of the ninth transistor T9 may be electrically connected to the sixth control signal terminal 66, and a second electrode of the ninth transistor T9 may be electrically connected to the gate of the third transistor T3.

Figure 10:
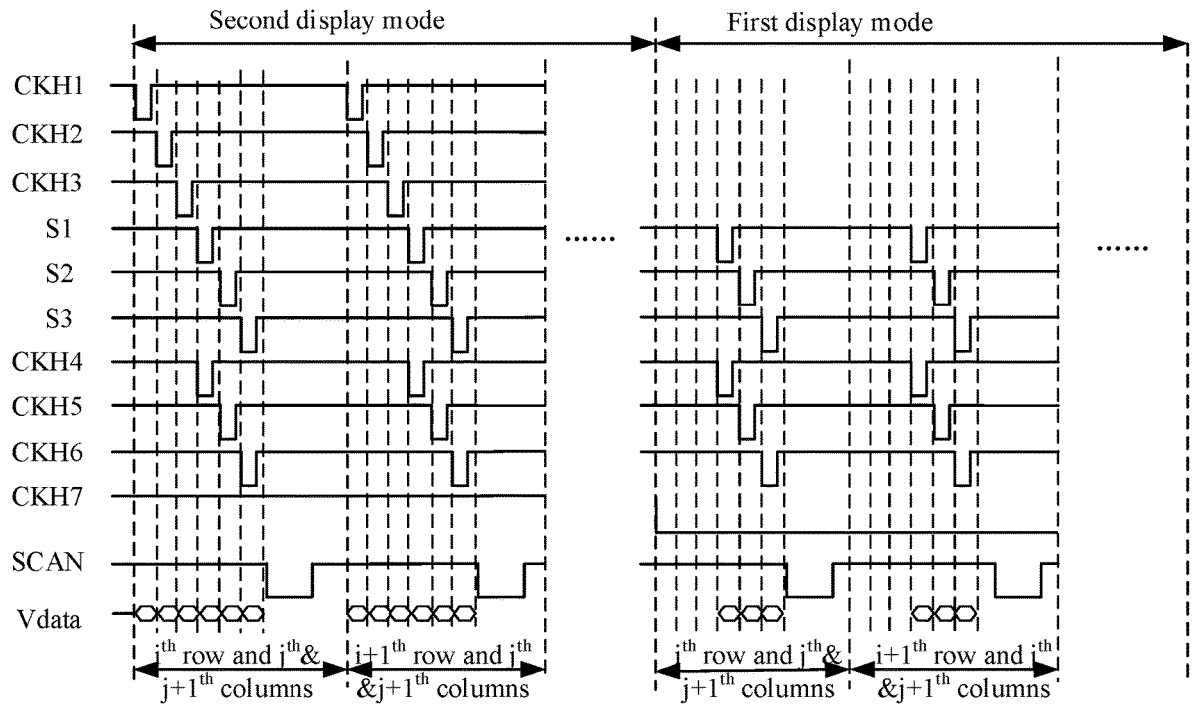
FIG. 10 illustrates an exemplary timing sequence diagram of a display panel in FIG. 9.

Referring to FIG. 10, S1, S2, and S3 in FIG. 10 may represent signals received by the gates of the first transistor T1, the second transistor T2, and the third transistor T3, respectively. For example, for illustrative purposes, the transistors T1-T9 may be P-type transistors. Referring to FIG. 10, in the first display mode, the control unit 10 may be specifically configured to control the fourth control signal terminal 64, the fifth control signal terminal 65, and the sixth control signal terminal 66 to output turned-on levels in sequence, control the seventh control signal terminal 67 to output a turned-on level, and control the first control signal terminal 61, the second control signal terminal 62 and the third control signal terminal 63 to stop outputting a control signal.

Because the seventh control signal terminal 67 outputs a turned-on level, the transistors T7-T9 may be turned on, and the turned-on levels sequentially outputted from the fourth control signal terminal 64, the fifth control signal terminal 65, and the sixth control signal terminal 66 may be transmitted to the gates of the transistors T1-T3 through the transistors T7-T9, respectively. Therefore, the signal S1 received by the gate of the first transistor T1 may be the same as the control signal CKH4 outputted by the fourth control signal terminal 64. The signal S2 received by the gate of the second transistor T2 may be the same as the control signal CKH5 outputted by the fifth control signal terminal 65. The signal S3 received by the gate of the third transistor T3 may be the same as the control signal CKH6 outputted by the sixth control signal terminal 66. Thus, the fourth transistor T4 and the first transistor T1 may be simultaneously turned on, the fifth transistor T5 and the second transistor T2 may be simultaneously turned on, and the sixth transistor T6 and the third transistor T3 may be simultaneously turned on.

When the fourth transistor T4 and the first transistor T1 are simultaneously turned on, the data signal Vdata corresponding to the first sub-pixels P1 of the pixel units PU in the j+1$^{th}$ column outputted by the data signal terminal 40 may simultaneously reach the first data line 31 corresponding to the pixel units PU in the j$^{th}$ column through the first transistor T1 and the first data line 31 corresponding to the pixel units PU in the j+1$^{th}$ column through the fourth transistor T4, such that the first sub-pixels P1 of the pixel units PU in the j$^{th}$ column and the j+1$^{th}$ column may share one data signal. Similarly, when the fifth transistor T5 and the second transistor T2 are simultaneously turned on, the second sub-pixels P2 of the pixel units PU in the j$^{th}$ column and the j+1$^{th}$ column may share the data signal corresponding to the second sub-pixels P2 of the pixel units PU in the j+1$^{th}$ column. When the sixth transistor T6 and the third transistor T3 are simultaneously turned on, the third sub-pixels P3 of the pixel units PU in the j$^{th}$ column and the j+1$^{th}$ column may share the data signal corresponding to the third sub-pixels P3 of the pixel units PU in the j+1$^{th}$ column. Therefore, the pixel units PU in the j$^{th}$ column and the pixel units PU in the j+1$^{th}$ column may share the data signal, the driving chip of the display panel may merely need to provide the data signal corresponding to the pixel units PU in the j+1$^{th}$ column, thereby reducing the quantity of data signals outputted by the driving chip and reducing the power consumption of the driving chip of the display panel.

For example, referring to FIG. 10, merely the pixel units PU in the $j^{th}$ column and the $j+1^{th}$ column may share the data signal, and the pixel units PU in the $i^{th}$ row and the $i+1^{th}$ row may not share the data signal. Specifically, in the first display mode, the control unit 10 may control the control signals CKH4, CKH5, and CKH6 corresponding to the pixel units PU in the $i^{th}$ row and the $i+1^{th}$ row to be low levels in sequence, may control the control signal terminals 61-63 to stop outputting the control signal, may control the control signal CKH7 to be a low level, and may provide data signals respectively corresponding to the pixel units PU in the $i^{th}$ row and the $i+1^{th}$ row through the data signal terminal 40.

Figure 11:
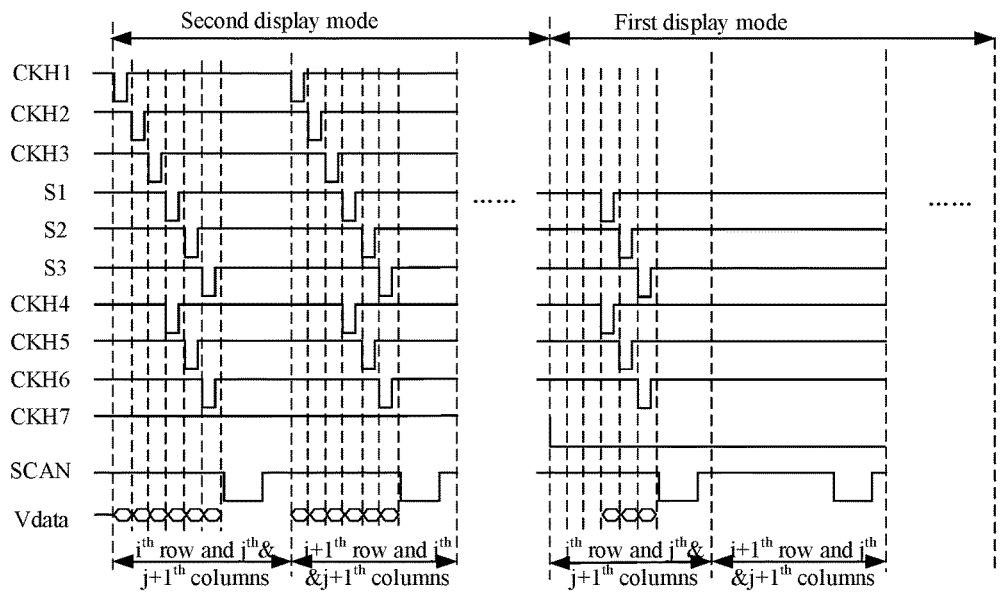
FIG. 11 illustrates another exemplary timing sequence diagram of a display panel in FIG. 9.

For another example, referring to FIG. 11, not only the pixel units PU in the $j^{th}$ column and the $j+1^{th}$ column may share the data signal, but also the pixel units PU in the $i^{th}$ row and the $i+1^{th}$ row may share the data signal. Specifically, in the first display mode, the control unit 10 may control the control signals CKH4, CKH5, and CKH6 corresponding to the pixel units PU in the $i^{th}$ row to be low levels in sequence, may control the control signals CKH4, CKH5, and CKH6 corresponding to the pixel units PU in the $i+1^{th}$ row to be a high-level, may control the control signal terminals 61-63 to stop outputting a control signal, may control the control signal CKH7 to be a low level, and may provide the data signal corresponding to the pixel unit in the $i^{th}$ row and the $j+1^{th}$ column through the data signal terminal 40, such that the four pixel units PU in the $i^{th}$ row and $j^{th}$ column, $i^{th}$ row and $j+1^{th}$ column, $i+1^{th}$ row and $j^{th}$ column, and $i+1^{th}$ row and $j+1^{th}$ column may share the data signal corresponding to the pixel unit in the $i^{th}$ row and the $j+1^{th}$ column.

Figure 12:
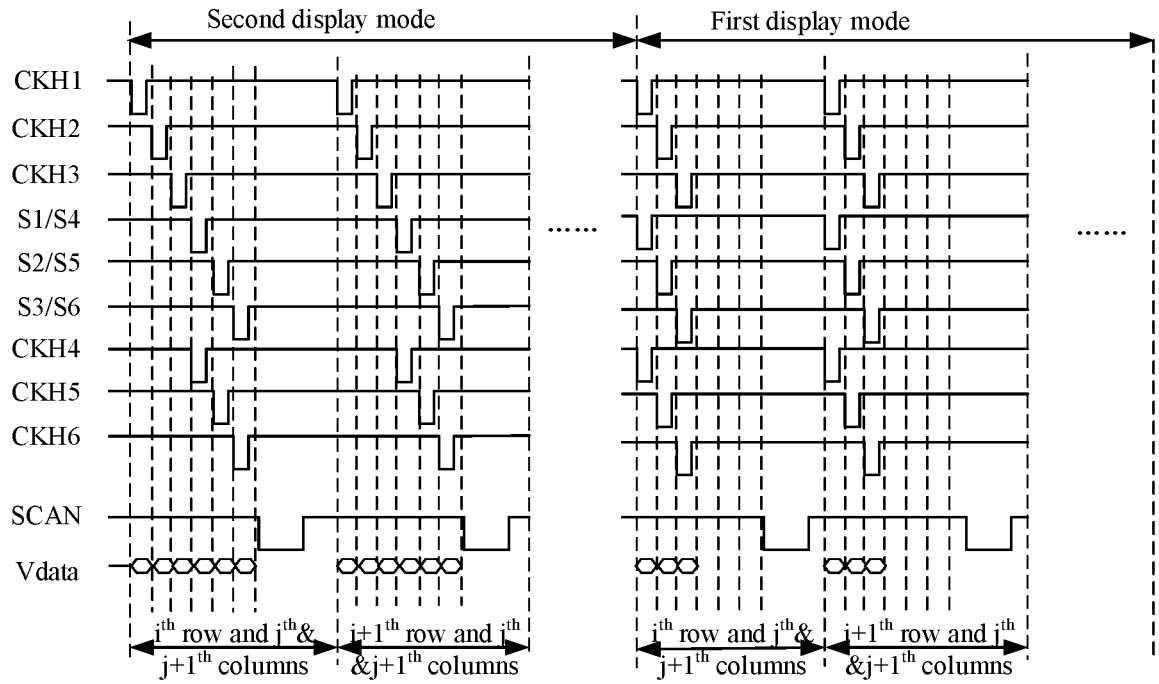
FIG. 12 illustrates another exemplary timing sequence diagram of a display panel in FIG. 9.

In certain embodiments, when the first switch unit 71 is not disposed, the purpose that merely the pixel units PU in the $j^{th}$ column and the $j+1^{th}$ column may share the data signal, and the pixel units PU in the $i^{th}$ row and the $i+1^{th}$ row may not share the data signal may be achieved. In one embodiment, referring to FIG. 4 and FIG. 12, the same or similar features between FIG. 12 and FIG. 7 may not be repeated, while the difference may include that in the first display mode, for the pixel units in the $i^{th}$ row and the $i+1^{th}$ row, the control unit 10 may control the control signal CKH4 outputted by the fourth control signal terminal 64 to be the same as the control signal CKH1 outputted by the first control signal terminal 61, may control the control signal CKH5 outputted by the fifth control signal terminal 65 to be the same as the control signal CKH2 outputted by the second control signal terminal 62, and may control the control signal CKH6 outputted by the sixth control signal terminal 66 to be the same as the control signal CKH3 outputted by the third control signal terminal 63.

Therefore, the fourth transistor T4 and the first transistor T1 may be simultaneously turned on, the fifth transistor T5 and the second transistor T2 may be simultaneously turned on, and the sixth transistor T6 and the third transistor T3 may be simultaneously turned on. Thus, the pixel units PU in the $j^{th}$ column and the pixel units PU in the $j+1^{th}$ column may share the data signal, the driving chip of the display panel may merely need to provide the data signal corresponding to the pixel units PU in the $j^{th}$ column, thereby reducing the quantity of data signals outputted by the driving chip and reducing the power consumption of the driving chip of the display panel.

Figure 13:
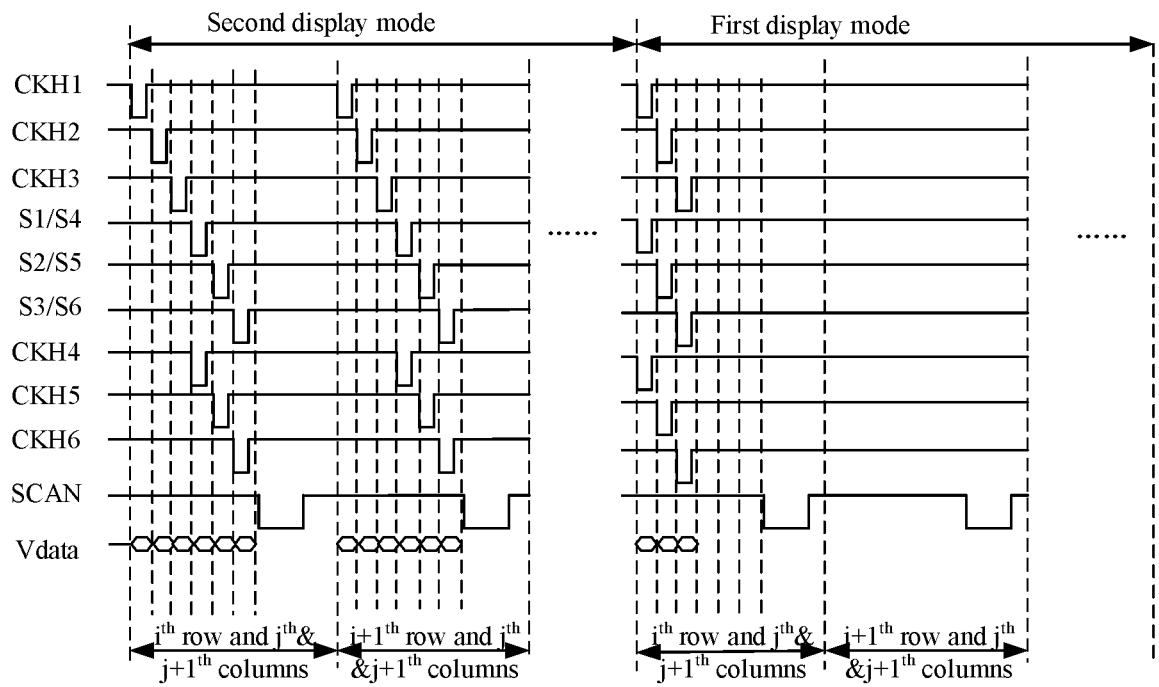
FIG. 13 illustrates another exemplary timing sequence diagram of a display panel in FIG. 9.

When the first switch unit 71 is not disposed, the purpose that not only the pixel units PU in the $j^{th}$ column and the $j+1^{th}$ column may share the data signal, but also the pixel units PU in the $i^{th}$ row and the $i+1^{th}$ row may share the data signal may be achieved. Specifically, referring to FIG. 4 and FIG. 13, the same or similar features between FIG. 13 and FIG. 8 may not be repeated, while the difference may include that in the first display mode, the control unit 10 may control the control signals CKH1, CKH2, and CKH3 corresponding to the pixel units PU in the $i^{th}$ row to be low levels in sequence, may control the control signals corresponding to the pixel units PU in the $i^{th}$ row CKH4 to be the same as CKH1, CKH5 to be the same as CKH2, and CKH6 to be the same as CKH3, and may control the control signals CKH1, CKH2, CKH3, CKH4, CKH5, and CKH6 corresponding to the pixel units PU in the $i+1^{th}$ row to be a high level.

Figure 14:
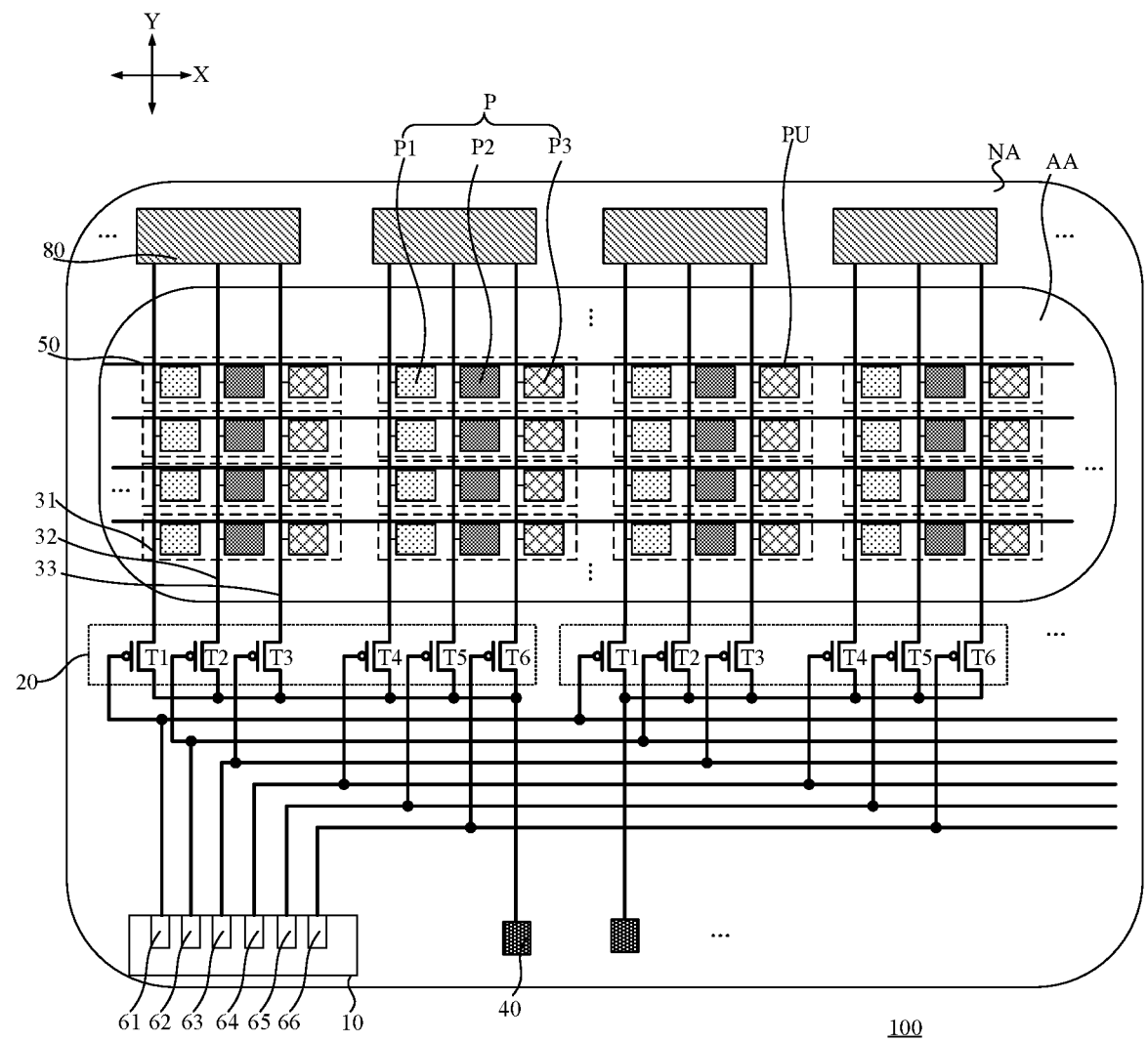
FIG. 14 illustrates a schematic top view of another exemplary display panel consistent with disclosed embodiments of the present disclosure.

In certain embodiments, referring to FIG. 14, the display panel 100 may further include at least one black state control unit 80, and the black state control unit 80 may be disposed in the non-display region NA. The pixel units PU in at least one column may be electrically connected to the black state control unit 80 through the data line 30. The control unit 10 may be further configured, in the first display mode, to control at least one black state control unit 80 to be in a turned-on state, such that pixel units PU in one column electrically connected to the black state control unit 80 in the turned-on state may be in a black state.

In one embodiment, the black state control unit 80 may include a control terminal, and the control unit 10 may be configured to control the level of a control signal provided to the control terminal of the black state control unit 80, to control the black state control unit 80 to be in a turned-on or turned-off state.

In the disclosed embodiments, through configuring the pixel units PU in one column electrically connected to the black state control unit 80 in a turned-on state to be in the black state, on the one hand, the pixel units that should be in the black state may be stably in the black state to prevent the occurrence of lighting; on the other hand, the driving chip may no longer need to provide a data signal to the pixel units PU in the black state, thereby reducing the quantity of data signals outputted by the driving chip and reducing the power consumption of the driving chip.

Referring to FIG. 14, a quantity of black state control units 80 may be the same as a quantity of columns of the pixel units PU. In other words, the quantity of black state control units 80 may be N, and the black state control unit 80 may one-to-one correspond to each column of pixel units PU.

In certain embodiments, the control unit 10 may be specifically configured, in the first display mode, to control the black state control unit 80 electrically connected to the pixel units PU in an odd column to be in a turned-off state, and control the black state control unit 80 electrically connected to the pixel units PU in an even column to be in a turned-on state.

In other words, in the first display mode, the pixel units PU in alternate columns may be lit. Specifically, the pixel units PU in an odd column may be lit, while the pixel units PU in an even column may always be in the black state, which may make the driving chip not provide the data signal to the pixel units in the even column.

In one embodiment, the control unit 10 may control the control signal terminals 61-63 to output turned-on levels in sequence to enable the transistors T1-T3 to be turned on in sequence, and may control the control signal terminals 64-66 to output a turned-off level to enable the transistors T4-T6 to be maintained at a turned-off state.

In certain embodiments, the control unit 10 may be specifically configured, in the first display mode, to control the black state control unit 80 electrically connected to the pixel units PU in an odd column to be in the turned-on state, and control the black state control unit 80 electrically connected to the pixel units PU in an even column to be in the turned-off state.

In other words, in the first display mode, the pixel units PU in alternate columns may be lit. Specifically, the pixel units PU in an even column may be lit, while the pixel units PU in an odd column may always be in the black state, which may make the driving chip not provide the data signal to the pixel units in the odd column.

In one embodiment, the control unit 10 may control the control signal terminals 64-66 to output turned-on levels in sequence to enable the transistors T4-T6 to be turned on in sequence, and may control the control signal terminals 61-63 to output a turned-off level to enable the transistors T1-T3 to be maintained at a turned-off state.

In certain embodiments, in the first display mode, the control unit 10 may be specifically configured to control the black state control unit 80 electrically connected to the pixel units PU in an odd column to be in a turned-off state, and control the black state control unit 80 electrically connected to the pixel units PU in an even column to be in a turned-on state. After an interval of N1 frames, in the first display mode, the control unit 10 may be specifically configured to control the black state control unit 80 electrically connected to the pixel units PU in an odd column to be in a turned-on state, and control the black state control unit 80 electrically connected to the pixel units PU in an even column to be in a turned-off state, where N1 may be an integer and N1≥1.

In the disclosed embodiments, the pixel units in each column may be alternately in a lit state and a black state. In other words, the transistors T1-T6 may be alternately in a turned-on and a turned-off state, which may prevent the problem of non-stability caused by transistors being in a turned-off state for a long period.

In one embodiment, in the first display mode, the refresh rate of the display panel may be 30 Hz, and N1 may be equal to 30, 60, 90, etc. The specific value of N1 may not be limited by the present disclosure.

In one embodiment, in a third display mode, the control unit 10 may be specifically configured to control the entire black state control units 80 to be in a turned-on state, such that the entire pixel units PU may be in the black state. It should be understood that the third display mode may be a black screen display mode.

In one embodiment, in the third display mode, the control unit 10 may control the control signal terminals 61-66 to output turned-off levels, such that the transistors T1-T6 may be maintained in the turned-off state. In addition, the driving chip may not need to output a data signal corresponding to any pixel unit.

Figure 15:
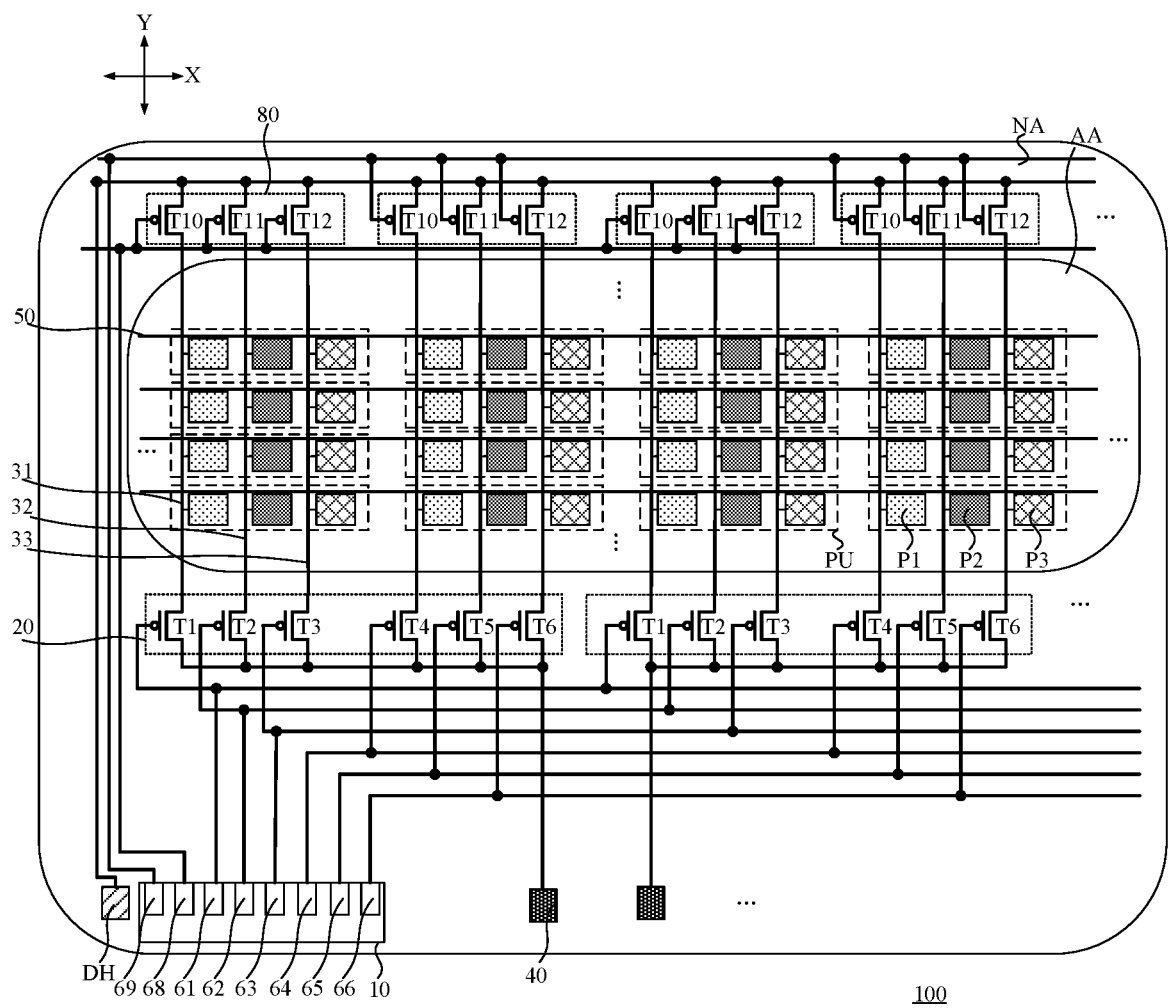
FIG. 15 illustrates a schematic top view of another exemplary display panel consistent with disclosed embodiments of the present disclosure.

In certain embodiments, referring to FIG. 15, the pixel unit PU may include a first sub-pixel P1, a second sub-pixel P2, and a third sub-pixel P3. The data line 30 may include a first data line 31, a second data line 32 and a third data line 33. The first sub-pixel P1 may be connected to the first data line 31, the second sub-pixel P2 may be connected to the second data line 32, and the third sub-pixel P3 may be connected to the third data line 33.

The black state control unit 80 may include a tenth transistor T10, an eleventh transistor T11 and a twelfth transistor T12. First electrodes of the tenth transistor T10, the eleventh transistor T11, and the twelfth transistor T12 may be electrically connected to a fixed voltage terminal DH. A second electrode of the tenth transistor T10 may be electrically connected to the first data line 31, a second electrode of the eleventh transistor T11 may be electrically connected to the second data line 32, and a second electrode of the twelfth transistor T12 may be electrically connected to the third data line 33. Gates of the tenth transistor T10, the eleventh transistor T11, and the twelfth transistor T12 corresponding to the pixel units PU in an odd column may be electrically connected to an eighth control signal terminal 68. Gates of the tenth transistor T10, the eleventh transistor T11, and the twelfth transistor T12 corresponding to the pixel units PU in an even column may be electrically connected to a ninth control signal terminal 69.

In one embodiment, the fixed voltage terminal DH may output a black state voltage, and after the black state voltage is written into the sub pixel, the sub pixel may be in a black state. The fixed voltage terminal DH may be disposed in the non-display region NA of the display panel. The fixed voltage terminal DH may not need to be integrated on the driving chip. Therefore, in the third display mode, the black state voltage may not come from the driving chip. It should be understood that the driving chip may not operate in the third display mode.

Figure 16:
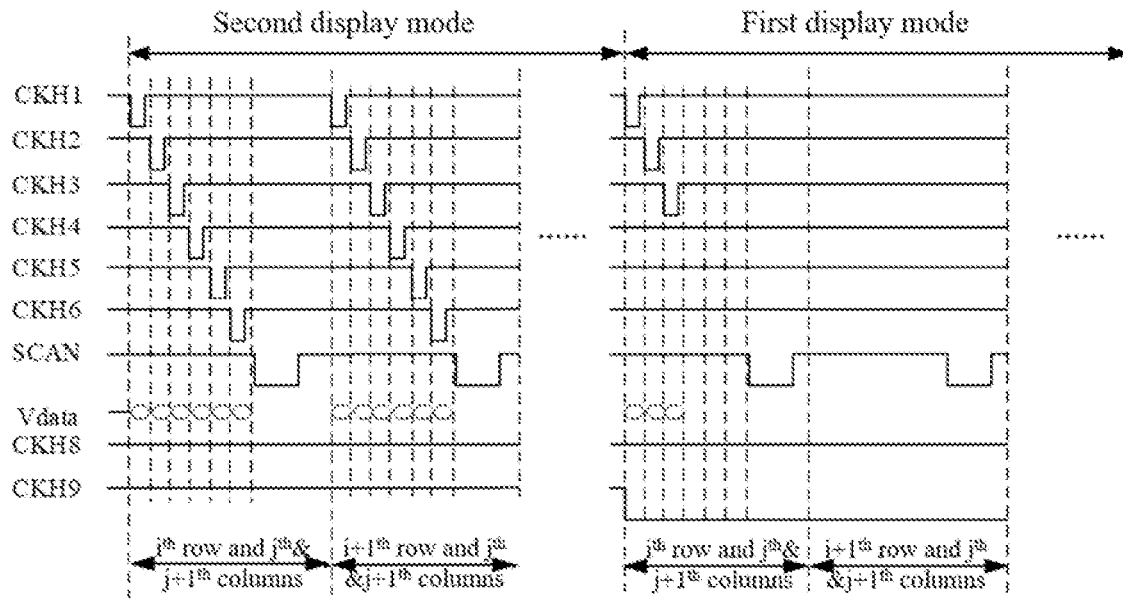
FIG. 16 illustrates an exemplary timing sequence diagram of a display panel in FIG. 15.

Referring to FIG. 16, for illustrative purposes, the black state control unit 80 corresponding to the pixel units PU in an even column may be in a turned-on state, black state control unit 80 corresponding to the pixel units PU in an odd column may be in a turned-off state, and the transistors T10-T12 may be P-type transistors as an example. The control signal outputted by the eighth control signal terminal 68 may be CKH8, and the control signal outputted by the ninth control signal terminal 69 may be CKH9. In the second display mode, the control signals CKH8 and CKH9 may be at a high-level, such that the transistors T10-T12 may be in a turned-off state. In the first display mode, the control signal CKH8 may be at a high-level, such that the transistors T10-T12 corresponding to the pixel units PU in an odd column may be in a turned-off state; the control signal CKH9 may be at a low level, such that the transistors T10-T12 corresponding to the pixel units PU in an even column may be in a turned-on state. The black state voltage outputted by the fixed voltage terminal DH may be written into the pixel units PU in an even column, and the pixel units PU in the even column may be in the black state. In addition, the control signals CKH4, CKH5, and CKH6 may be at a high-level, and the driving chip may stop outputting a data signal corresponding to the pixel units PU in the even column.

Figure 17:
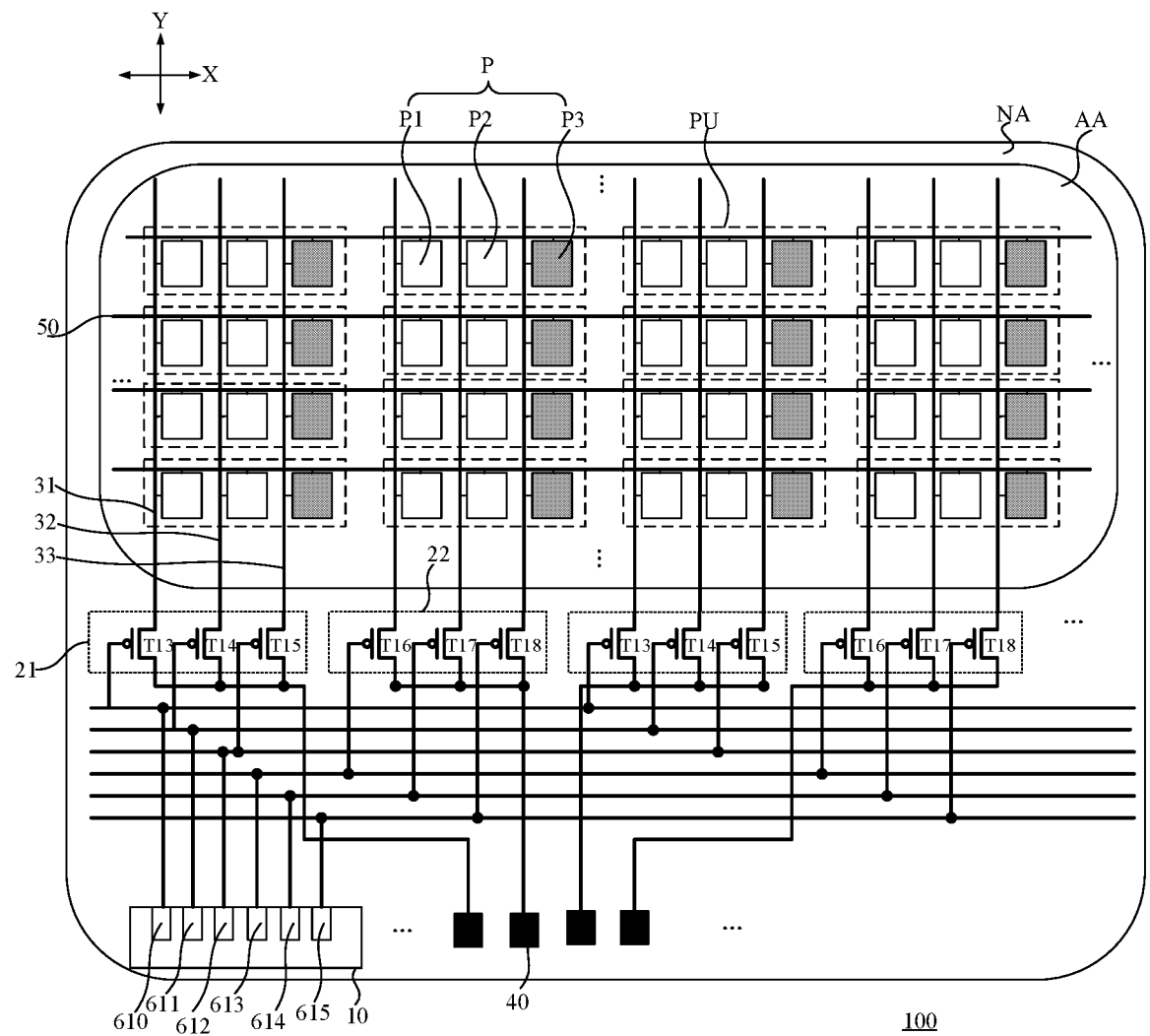
FIG. 17 illustrates a schematic top view of another exemplary display panel consistent with disclosed embodiments of the present disclosure.

In certain embodiments, referring to FIG. 17, the multi-channel multiplexer 20 may include a first multi-channel multiplexer 21 and a second multi-channel multiplexer 22. The first multi-channel multiplexer 21 may be electrically connected to corresponding pixel units PU in the $j^{th}$ column, and the second multi-channel multiplexer 22 may be electrically connected to corresponding pixel units PU in the $j+1^{th}$ column. The pixel unit PU may include a first sub-pixel P1, a second sub-pixel P2, and a third sub-pixel P3. The data line 30 may include a first data line 31, a second data line 32 and a third data line 33. The first sub-pixel P1 may be connected to the first data line 31, the second sub-pixel P2 may be connected to the second data line 32, and the third sub-pixel P3 may be connected to the third data line 33.

The first multi-channel multiplexer 21 may include a thirteenth transistor T13, a fourteenth transistor T14, and a fifteenth transistor T15. The second multi-channel multiplexer 22 may include a sixteenth transistor T16, a seventeenth transistor T17, and an eighteenth transistor T18. First electrodes of the thirteenth transistor T13, the fourteenth transistor T14 and the fifteenth transistor T15 may be electrically connected to one of the data signal terminals 40. First electrodes of the sixteenth transistor T16, the seventeenth transistor T17 and the eighteenth transistor T18 may be electrically connected to the another one of the data signal terminals 40. Second electrodes of the thirteenth transistor T13, the fourteenth transistor T14, and the fifteenth transistor T15 may be electrically connected to the first data line 31, the second data line 32, and the third data line 33 corresponding to the pixel units PU in the $i^{th}$ column, respectively. Second electrodes of the sixteenth transistor T16, the seventeenth transistor T17, and the eighteenth transistor T18 may be electrically connected to the first data line 31, the second data line 32, and the third data line 33 corresponding to the pixel units PU in the $j+1^{th}$ column, respectively. Gates of the thirteenth transistor T13, the fourteenth transistor T14, the fifteenth transistor T15, the sixteenth transistor T16, the seventeenth transistor T17, and the eighteenth transistor T18 may be electrically connected to a tenth control signal terminal 610, an eleventh control signal terminal 611, a twelfth control signal terminal 612, a thirteenth control signal terminal 613, a fourteenth control signal terminal 614, and a fifteenth control signal terminal 615, respectively.

In one embodiment, the control signal terminals 610-615 may be integrated on the control unit 10, and the control signal terminals 610-615 may output voltage signals. The entire transistors T13-T18 may be P-type transistors, or may be N-type transistors. In another embodiment, part of the transistors T13-T18 may be P-type transistors, and the other part may be N-type transistors. The control signals outputted by the control signal terminals 610-615 may be CKH10, CKH11, CKH12, CKH13, CKH14, CKH15, respectively. For illustrative purposes, the entire transistors T13-T18 may be P-type transistors as an example.

Figure 18:
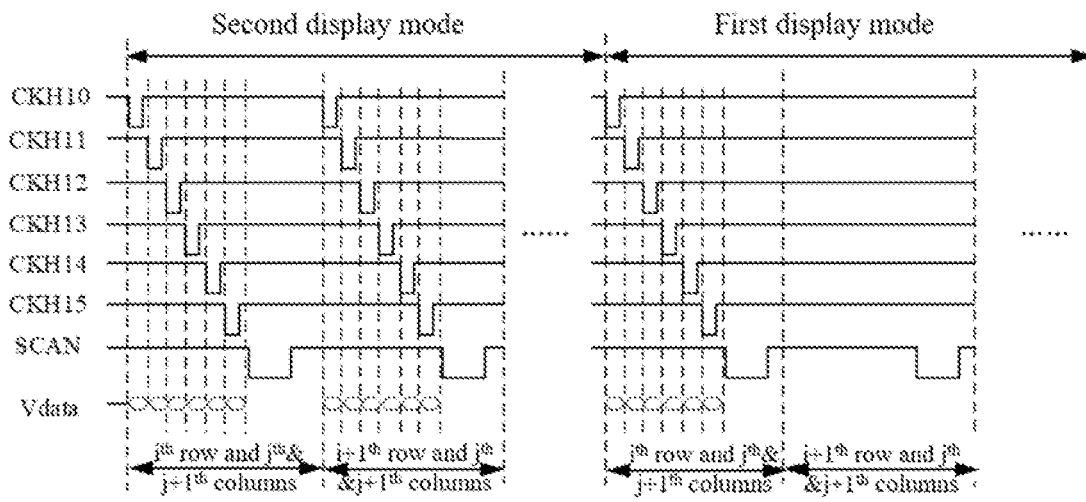
FIG. 18 illustrates an exemplary timing sequence diagram of a display panel in FIG. 17.

Referring to FIG. 18, in the second display mode, for pixel units PU in each row, the control signal terminals 610-615 may output turned-on levels in sequence. For example, the control signals CKH10, CKH11 CKH12, CKH13, CKH14, CKH15 corresponding to pixel units PU in each row may be low levels in sequence, such that the transistors T13-T18 may be turned on in sequence. In the second display mode, for pixel units PU in each row, the control signal terminals 610-615 may output turned-on levels in sequence, which may prevent the pixel units from sharing a data signal and may avoid affecting the display quality of the display panel.

For illustrative purposes, a quantity of rows of the pixel units PU may be M, where M may be an integer and 1≤i≤M and "I" may be an odd number as an example. In the first display mode, the control unit 10 may control the control signals CKH10, CKH11, CKH12, CKH13, CKH14, CKH15 corresponding to the pixel units PU in the $j^{th}$ column and the $j+1^{th}$ column of $i^{th}$ row to be low levels in sequence, such that the transistors T13-T18 may be turned on in sequence, and the data signals Vdata sequentially outputted by the data signal terminal 40 may be transmitted to the data line 30. When the scan signal SCAN corresponding to the pixel units PU in the $i^{th}$ row is a low level, the data signal on the data line 30 may be written into the pixel units PU in the $i^{th}$ row.

The control unit 10 may control the control signals CKH10, CKH11, CKH12, CKH13, CKH14, and CKH15 corresponding to the pixel units PU in the $i^{th}$ column and the $j+1^{th}$ column of $i+1^{th}$ row to be a high-level, such that the transistors T13-T18 may be turned off. In view of this, the driving chip of the display panel may stop outputting a data signal. Because the data signal corresponding to the pixel units PU in the $i^{th}$ row is temporarily stored on the data line 30, when the scan signal SCAN corresponding to the pixel units PU in the $i+1^{th}$ row is a low level, the data signal corresponding to the pixel units PU in the $i^{th}$ row temporarily stored on the data line 30 may be written into the pixel units PU in the $i+1^{th}$ row. Therefore, the pixel units PU in the $i^{th}$ row and the pixel units PU in the $i+1^{th}$ row may share the data signal, and the driving chip of the display panel may merely need to provide the data signal corresponding to the pixel units PU in the $i^{th}$ row, thereby reducing the quantity of data signals outputted by the driving chip and reducing the power consumption of the driving chip of the display panel.

It should be understood that in the disclosed embodiments, although the data signal corresponding to the pixel units PU in the $i+1^{th}$ row is not provided, because the pixel units PU in the $i+1^{th}$ row shares the data signal corresponding to the pixel units PU in the $i^{th}$ row, the pixel units PU in the $i+1^{th}$ row may also be lit, to prevent the obvious observable gap caused by non-lit pixel units PU in the $i+1^{th}$ row.

Figure 19:
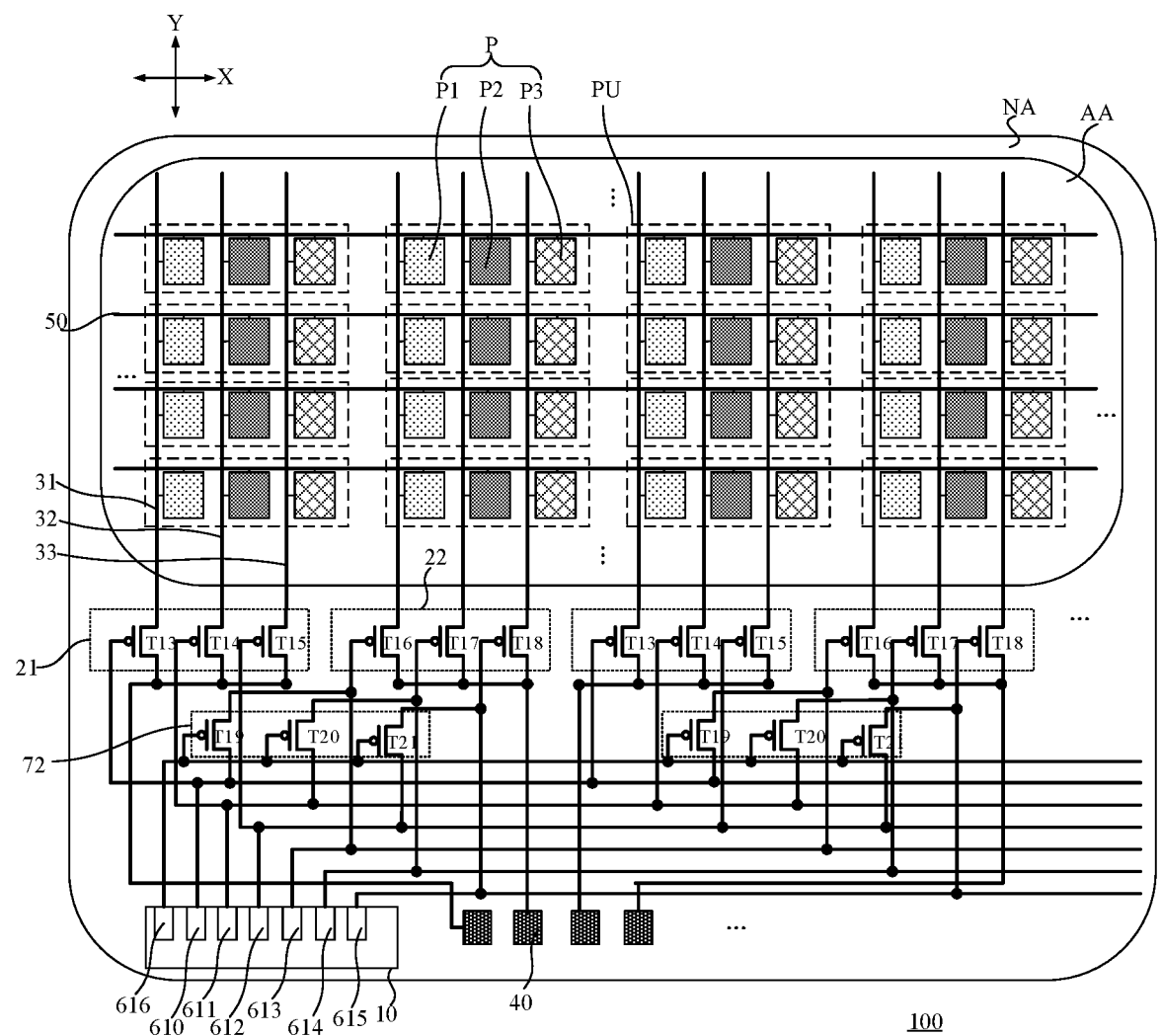
FIG. 19 illustrates a schematic top view of another exemplary display panel consistent with disclosed embodiments of the present disclosure.

In certain embodiments, referring to FIG. 19, the display panel 100 may further include a second switch unit 72. The second switch unit 72 may include a nineteenth transistor T19, a twentieth transistor T20, and a twenty-first transistor T21. Gates of the nineteenth transistor T19, the twentieth transistor T20, and the twenty-first transistor T21 may be electrically connected to the sixteenth control signal terminal 616. A first electrode of the nineteenth transistor T19 may be electrically connected to the tenth control signal terminal 610, and a second electrode of the nineteenth transistor T19 may be electrically connected to the first electrode of the sixteenth transistor T16. A first electrode of the twentieth transistor T20 may be electrically connected to the eleventh control signal terminal 611, and a second electrode of the twentieth transistor T20 may be electrically connected to the first electrode of the seventeenth transistor T17. A first electrode of the twenty-first transistor T21 may be electrically connected to the twelfth control signal terminal 612, and a second electrode of the twenty-first transistor T21 may be electrically connected to the first electrode of the eighteenth transistor T18.

In one embodiment, the sixteenth control signal terminal 616 may be integrated on the control unit 10.

Figure 20:
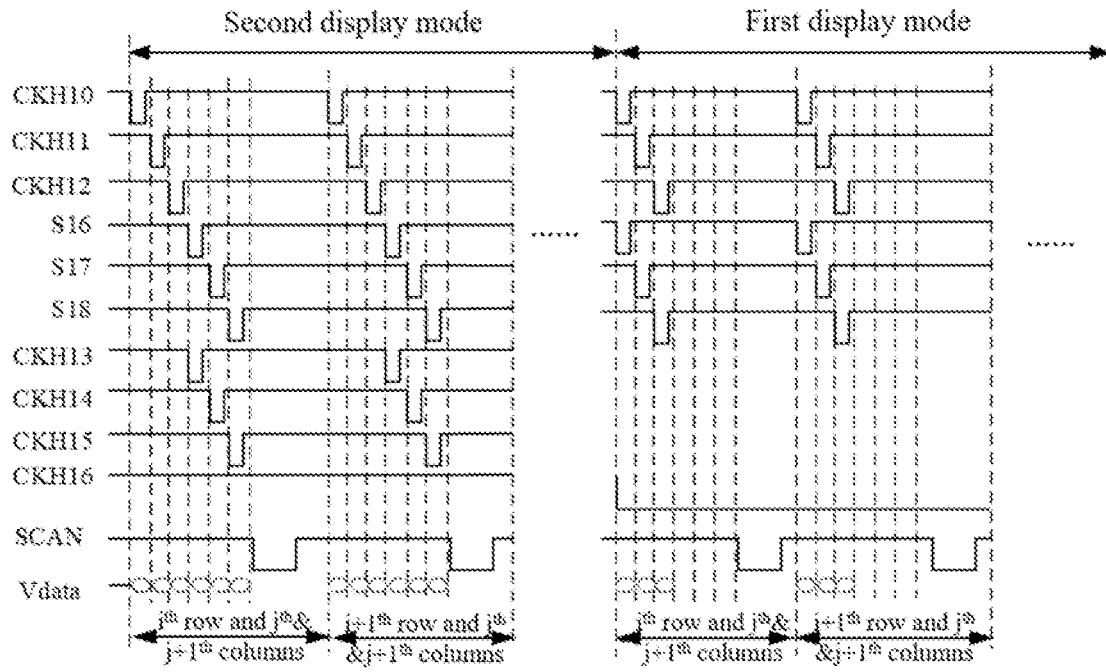
FIG. 20 illustrates an exemplary timing sequence diagram of a display panel in FIG. 19.

Referring to FIG. 20, S16, S17, and S18 in FIG. 20 may represent signals received by the gates of the sixteenth transistor T16, the seventeenth transistor T17, and the eighteenth transistor T18, respectively. In one embodiment, for illustrative purposes, the entire transistors T13-T21 may be P-type transistors as an example. The control signals CKH10, CKH11, CKH12, CKH13, CKH14, and CKH15 corresponding to the second display mode shown in FIG. 20 may be the same as the control signals corresponding to the second display mode shown in FIG. 5, and the control signal CKH16 outputted by the sixteenth control signal terminal 616 in the second display mode shown in FIG. 20 may be a high-level, such that the transistors T19-T21 may be turned off, thereby preventing the control signals CKH10, CKH11, CKH12 from being transmitted to the transistors T16-T18.

Referring to FIG. 20, in the first display mode, the control unit 10 may be specifically configured to control the tenth control signal terminal 610, the eleventh control signal terminal 611, and the twelfth control signal terminal 612 to output turned-on levels in sequence, control the sixteenth control signal terminal 616 to output a turned-on level, and control the thirteenth control signal terminal 613, the fourteenth control signal terminal 614, and the fifteenth control signal terminal 615 to stop outputting a control signal.

Because the sixteenth control signal terminal 616 outputs a turned-on level, the transistors T19-T21 may be turned on, and the turned-on levels sequentially outputted from the tenth control signal terminal 610, the eleventh control signal terminal 611, and the twelfth control signal terminal 612 may be transmitted to the gates of the transistors T16-T18 through the transistors T19-T21, respectively. Therefore, the signal S16 received by the gate of the sixteenth transistor T16 may be the same as the control signal CKH10 outputted by the tenth control signal terminal 610. The signal S17 received by the gate of seventeenth transistor T17 may be the same as the control signal CKH11 outputted by the eleventh control signal terminal 611. The signal S18 received by the gate of the eighteenth transistor T18 may be the same as the control signal CKH12 outputted by the twelfth control signal terminal 612. Thus, the sixteenth transistor T16 and the thirteenth transistor T13 may be simultaneously turned on, the seventeenth transistor T17 and the fourteenth transistor T14 may be simultaneously turned on, and the eighteenth transistor T18 and the fifteenth transistor T15 may be simultaneously turned on.

When the sixteenth transistor T16 and the thirteenth transistor T13 are simultaneously turned on, the data signal Vdata corresponding to the first sub-pixels P1 of the pixel units PU in the $j^{th}$ column outputted by the data signal terminal 40 may simultaneously reach the first data line 31 corresponding to the pixel units PU in the $j^{th}$ column through the thirteenth transistor T13 and the first data line 31 corresponding to the pixel units PU in the $j+1^{th}$ column through the sixteenth transistor T16, such that the first sub-pixels P1 of the pixel units PU in the $j^{th}$ column and the $j+1^{th}$ column may share one data signal. Similarly, when the seventeenth transistor T17 and the fourteenth transistor T14 are simultaneously turned on, the second sub-pixels P2 of the pixel units PU in the $j^{th}$ column and the $j+1^{th}$ column may share the data signal corresponding to the second sub-pixels P2 of the pixel units PU in the $j^{th}$ column. When the eighteenth transistor T18 and the fifteenth transistor T15 are simultaneously turned on, the third sub-pixels P3 of the pixel units PU in the $j^{th}$ column and the $j+1^{th}$ column may share the data signal corresponding to the third sub-pixels P3 of the pixel units PU in the $j^{th}$ column. Therefore, the pixel units PU in the $j^{th}$ column and the pixel units PU in the $j+1^{th}$ column may share the data signal, the driving chip of the display panel may merely need to provide the data signal corresponding to the pixel units PU in the $j^{th}$ column, thereby reducing the quantity of data signals outputted by the driving chip and reducing the power consumption of the driving chip of the display panel.

It should be understood that in the disclosed embodiments, although the data signal corresponding to the pixel units PU in the $j+1^{th}$ column is not provided, because the pixel units PU in the $j+1^{th}$ column shares the data signal corresponding to the pixel units PU in the $j^{th}$ column, the pixel units PU in the $j+1^{th}$ column may also be lit, to prevent the obvious observable gap caused by non-lit pixel units PU in the $j+1^{th}$ column.

For example, referring to FIG. 20, merely the pixel units PU in the $j^{th}$ column and the $j+1^{th}$ column may share the data signal, and the pixel units PU in the $i^{th}$ row and the $i+1^{th}$ row may not share the data signal. Specifically, in the first display mode, the control unit 10 may control the control signals CKH10, CKH11, and CKH12 corresponding to the pixel units PU in the $i^{th}$ row and the $i+1^{th}$ row to be low levels in sequence, may stop outputting the control signals CKH13, CKH14, and CKH15, may control the control signal CKH16 to be a low level, and may provide data signals respectively corresponding to the pixel units PU in the $i^{th}$ row and the $i+1^{th}$ row through the data signal terminal 40.

Figure 21:
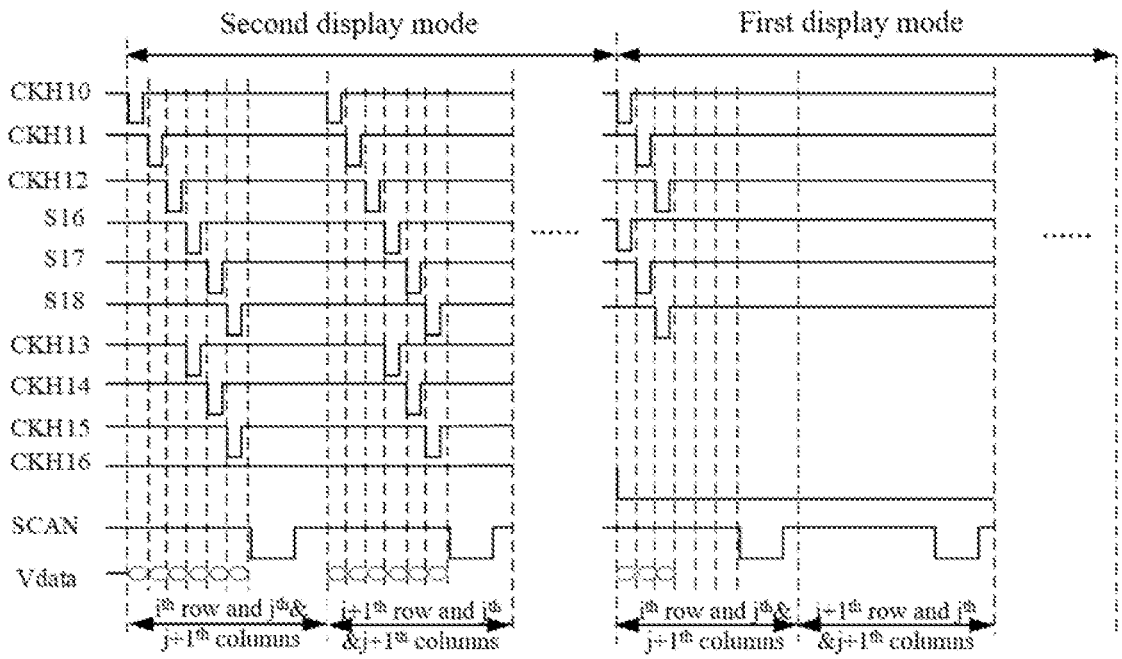
FIG. 21 illustrates another exemplary timing sequence diagram of a display panel in FIG. 19.

For another example, referring to FIG. 21, not only the pixel units PU in the $j^{th}$ column and the $j+1^{th}$ column may share the data signal, but also the pixel units PU in the $i^{th}$ row and the $i+1^{th}$ row may share the data signal. Specifically, in the first display mode, the control unit 10 may control the control signals CKH10, CKH11, and CKH12 corresponding to the pixel units PU in the $i^{th}$ row to be low levels in sequence, may control the control signals CKH10, CKH11, and CKH12 corresponding to the pixel units PU in the $i+1^{th}$ row to be a high-level, may stop outputting a control signal CKH13, CKH14, and CKH15, may control the control signal CKH16 to be a low level, and may provide the data signal corresponding to the pixel unit in the $i^{th}$ row and the $j^{th}$ column through the data signal terminal 40, such that the four pixel units PU in the $i^{th}$ row and $j^{th}$ column, $i^{th}$ row and $j+1^{th}$ column, $i+1^{th}$ row and $j^{th}$ column, and $i+1^{th}$ row and $j+1^{th}$ column may share the data signal corresponding to the pixel unit in the $i^{th}$ row and the $j^{th}$ column.

Figure 22:
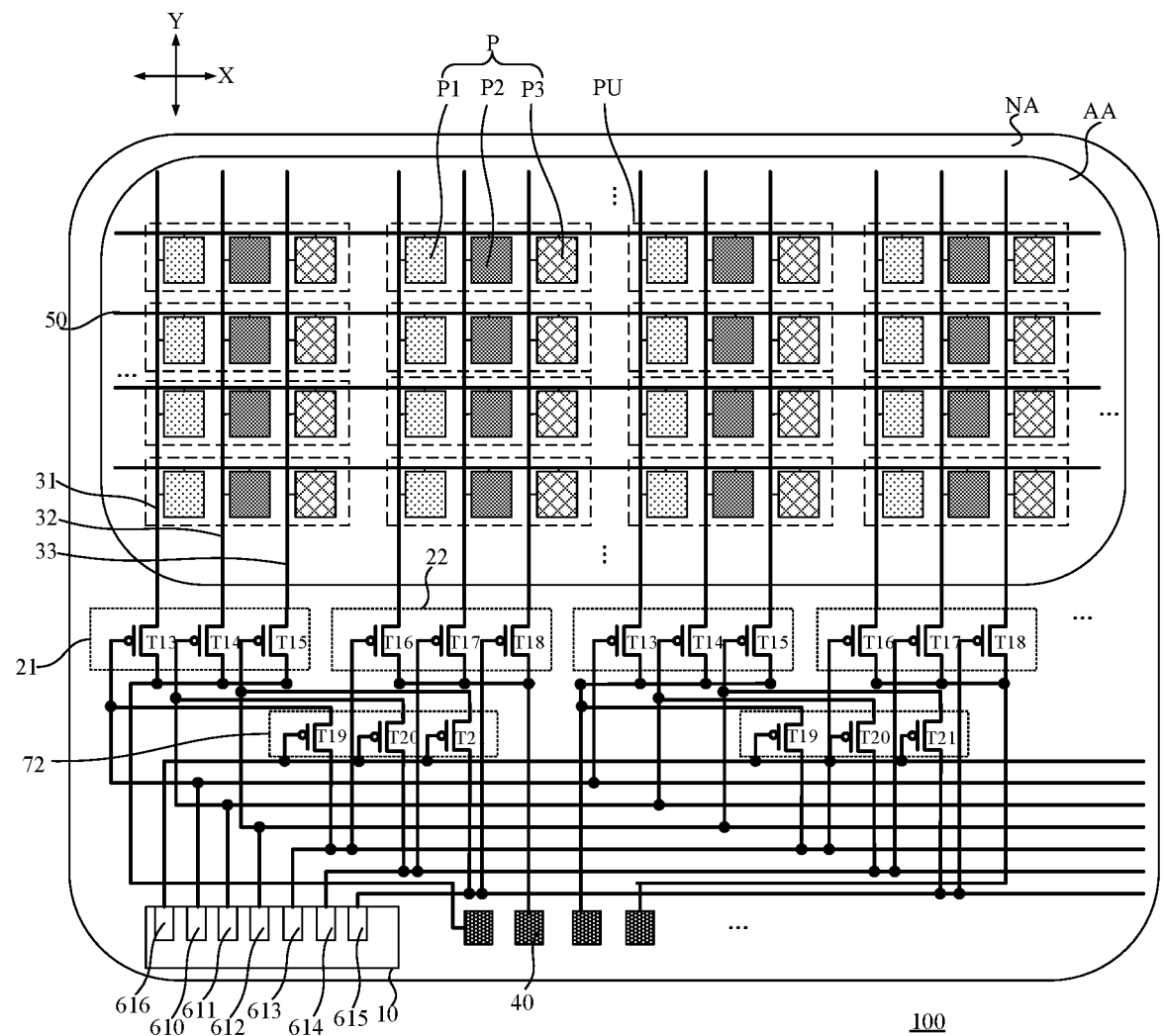
FIG. 22 illustrates a schematic top view of another exemplary display panel consistent with disclosed embodiments of the present disclosure.

In certain embodiments, referring to FIG. 22, the gates of the nineteenth transistor T19, the twentieth transistor T20, and the twenty-first transistor T21 may be electrically connected to the sixteenth control signal terminal 616. The first electrode of the nineteenth transistor T19 may be electrically connected to the thirteenth control signal terminal 613, and the second electrode of the nineteenth transistor T19 may be electrically connected to the first electrode of the thirteenth transistor T13. The first electrode of the twentieth transistor T20 may be electrically connected to the fourteenth control signal terminal 614, and the second electrode of the twentieth transistor T20 may be electrically connected to the first electrode of the fourteenth transistor T14. The first electrode of the twenty-first transistor T21 may be electrically connected to the fifteenth control signal terminal 615, and the second electrode of the twenty-first transistor T21 may be electrically connected to the first electrode of the fifteenth transistor T15.

Figure 23:
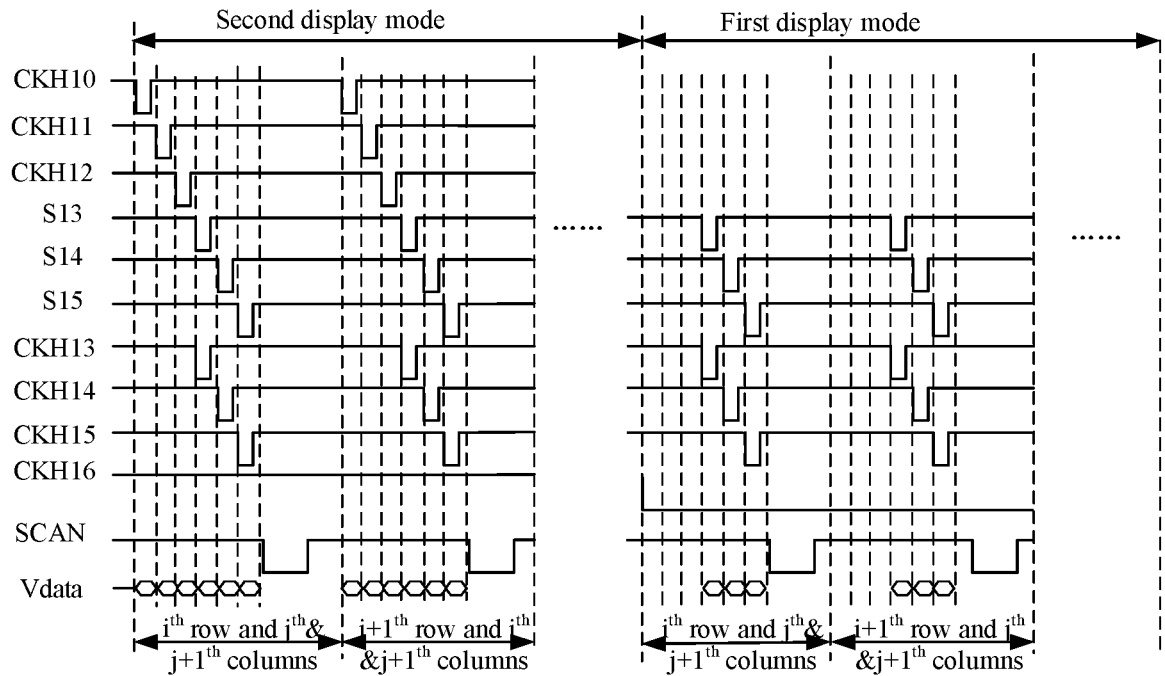
FIG. 23 illustrates an exemplary timing sequence diagram of a display panel in FIG. 22.

Referring to FIG. 23, S13, S14, and S15 in FIG. 23 may represent signals received by the gates of the thirteenth transistor T13, the fourteenth transistor T14, and the fifteenth transistor T15, respectively. For example, for illustrative purposes, the entire transistors T13-T21 may be P-type transistors as an example. Referring to FIG. 23, the control signals CKH10, CKH11, CKH12, CKH13, CKH14, and CKH15 corresponding to the second display mode shown in FIG. 23 may be the same as the control signals corresponding to the second display mode shown in FIG. 5, and the control signal CKH16 outputted by the sixteenth control signal terminal 616 in the second display mode shown in FIG. 23 may be a high-level, such that the transistors T19-T21 may be turned off, thereby preventing the control signals CKH10, CKH11, CKH12 from being transmitted to the transistors T16-T18.

Referring to FIG. 23, in the first display mode, the control unit 10 may be specifically configured to control the thirteenth control signal terminal 613, the fourteenth control signal terminal 614, and the fifteenth control signal terminal 615 to sequentially output turned-on levels, control the sixteenth control signal terminal 616 to output a turned-on level, and control the tenth control signal terminal 610, the eleventh control signal terminal 611, and the twelfth control signal terminal 612 to stop outputting a control signal.

Because the sixteenth control signal terminal 616 outputs a turned-on level, the transistors T19-T21 may be turned on, and the turned-on levels sequentially outputted from the thirteenth control signal terminal 613, the fourteenth control signal terminal 614, and the fifteenth control signal terminal 615 may be transmitted to the gates of the transistors T13-T15 through the transistors T19-T21, respectively. Therefore, the signal S13 received by the gate of thirteenth transistor T13 may be the same as the control signal CKH13 outputted by the thirteenth control signal terminal 613. The signal S14 received by the gate of the fourteenth transistor T14 may be the same as the control signal CKH14 outputted by the fourteenth control signal terminal 614. The signal S15 received by the gate of the fifteenth transistor T15 may be the same as the control signal CKH15 outputted by the fifteenth control signal terminal 615. Thus, the sixteenth transistor T16 and the thirteenth transistor T13 may be simultaneously turned on, the seventeenth transistor T17 and the fourteenth transistor T14 may be simultaneously turned on, and the eighteenth transistor T18 and the fifteenth transistor T15 may be simultaneously turned on.

When the sixteenth transistor T16 and the thirteenth transistor T13 are simultaneously turned on, the data signal Vdata corresponding to the first sub-pixels P1 of the pixel units PU in the j+1$^{th}$ column outputted by the data signal terminal 40 may simultaneously reach the first data line 31 corresponding to the pixel units PU in the j$^{th}$ column through the thirteenth transistor T13 and the first data line 31 corresponding to the pixel units PU in the j+1$^{th}$ column through the sixteenth transistor T16, such that the first sub-pixels P1 of the pixel units PU in the j$^{th}$ column and the j+1$^{th}$ column may share one data signal. Similarly, when the seventeenth transistor T17 and the fourteenth transistor T14 are simultaneously turned on, the second sub-pixels P2 of the pixel units PU in the j$^{th}$ column and the j+1$^{th}$ column may share the data signal corresponding to the second sub-pixels P2 of the pixel units PU in the j+1$^{th}$ column. When the eighteenth transistor T18 and the fifteenth transistor T15 are simultaneously turned on, the third sub-pixels P3 of the pixel units PU in the j$^{th}$ column and the j+1$^{th}$ column may share the data signal corresponding to the third sub-pixels P3 of the pixel units PU in the j+1$^{th}$ column. Therefore, the pixel units PU in the j$^{th}$ column and the pixel units PU in the j+1$^{th}$ column may share the data signal, the driving chip of the display panel may merely need to provide the data signal corresponding to the pixel units PU in the j+1$^{th}$ column, thereby reducing the quantity of data signals outputted by the driving chip and reducing the power consumption of the driving chip of the display panel.

For example, referring to FIG. 23, merely the pixel units PU in the j$^{th}$ column and the j+1$^{th}$ column may share the data signal, and the pixel units PU in the i$^{th}$ row and the i+1$^{th}$ row may not share the data signal. Specifically, in the first display mode, the control unit 10 may control the control signals CKH13, CKH14, and CKH15 corresponding to the pixel units PU in the i$^{th}$ row and the i+1$^{th}$ row to be low levels in sequence, may stop outputting the control signals CKH10, CKH11, and CKH12, may control the control signal CKH16 to be a low level, and may provide data signals respectively corresponding to the pixel units PU in the i$^{th}$ row and the i+1$^{th}$ row through the data signal terminal 40.

Figure 24:
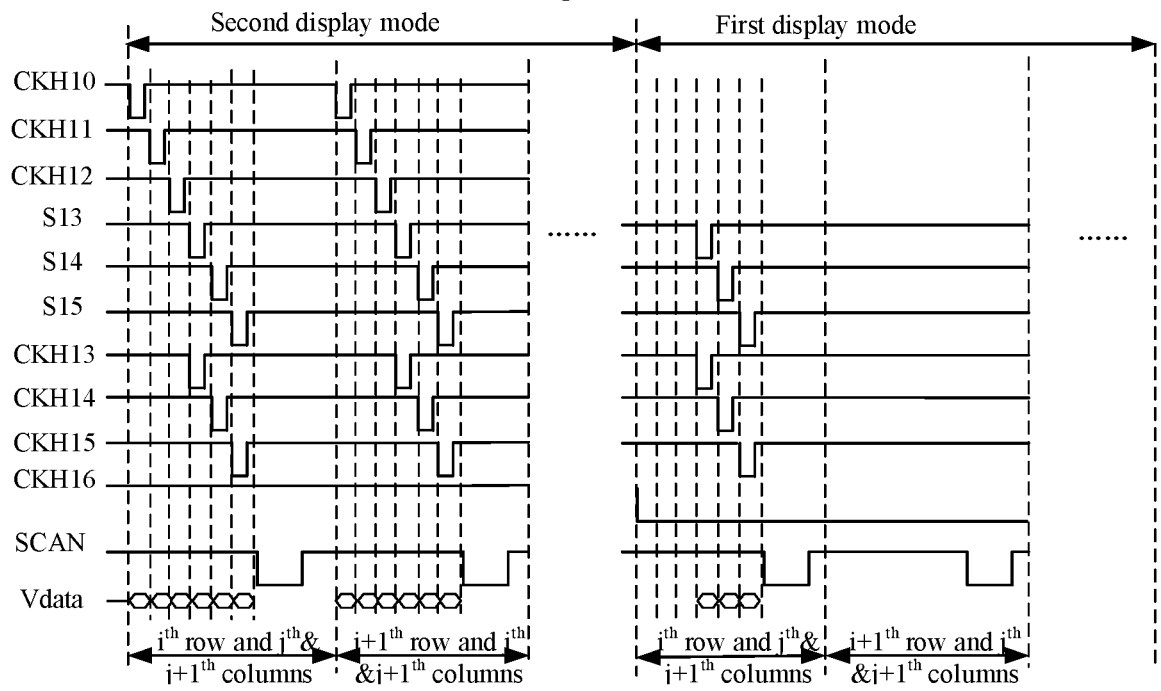
FIG. 24 illustrates another exemplary timing sequence diagram of a display panel in FIG. 22.

For another example, referring to FIG. 24, not only the pixel units PU in the j$^{th}$ column and the j+1$^{th}$ column may share the data signal, but also the pixel units PU in the i$^{th}$ row and the i+1$^{th}$ row may share the data signal. Specifically, in the first display mode, the control unit 10 may control the control signals CKH13, CKH14, and CKH15 corresponding to the pixel units PU in the i$^{th}$ row to be low levels in sequence, may control the control signals CKH13, CKH14, and CKH15 corresponding to the pixel units PU in the i+1$^{th}$ row to be a high-level, may stop outputting a control signal CKH10, CKH11, and CKH12, may control the control signal CKH16 to be a low level, and may provide the data signal corresponding to the pixel unit in the i$^{th}$ row and the j+1$^{th}$ column through the data signal terminal 40, such that the four pixel units PU in the i$^{th}$ row and j$^{th}$ column, i$^{th}$ row and j+1$^{th}$ column, i+1$^{th}$ row and j$^{th}$ column, and i+1$^{th}$ row and j+1$^{th}$ column may share the data signal corresponding to the pixel unit in the i$^{th}$ row and the j+1$^{th}$ column.

Figure 25:
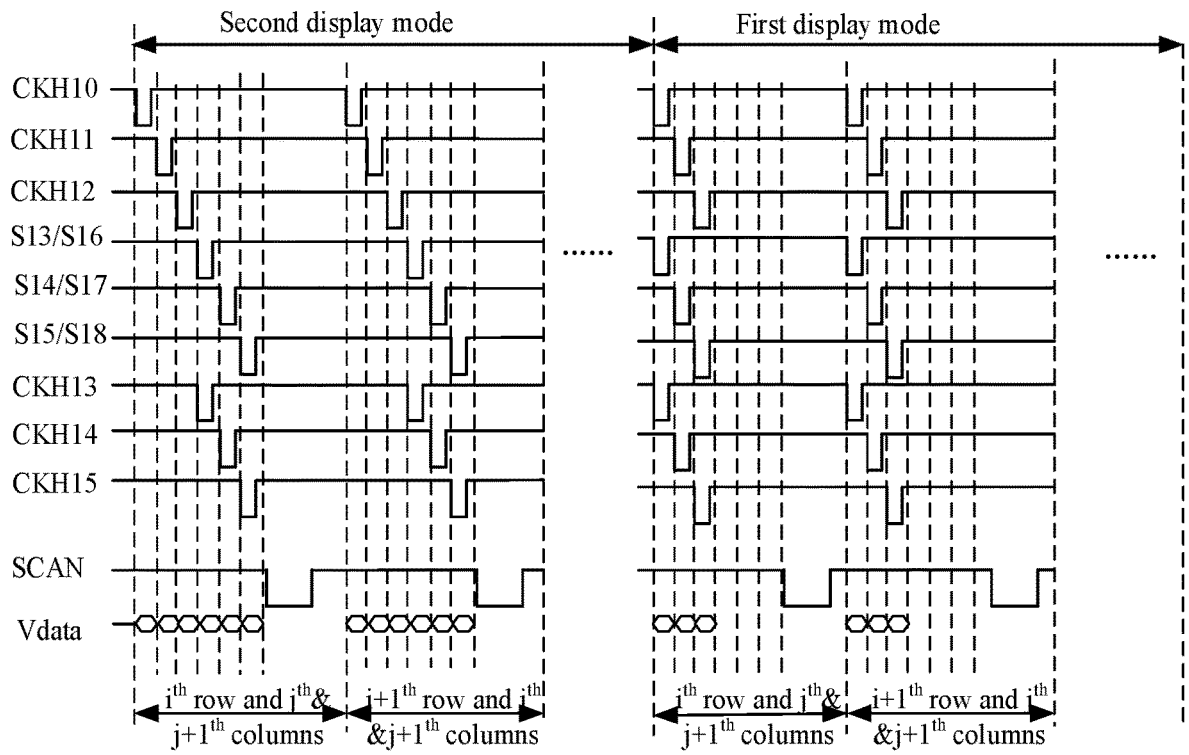
FIG. 25 illustrates another exemplary timing sequence diagram of a display panel in FIG. 17.

In certain embodiments, when the second switch unit 72 is not disposed, the purpose that merely the pixel units PU in the j$^{th}$ column and the j+1$^{th}$ column may share the data signal, and the pixel units PU in the i$^{th}$ row and the i+1$^{th}$ row may not share the data signal may be achieved. In one embodiment, referring to FIG. 17 and FIG. 25, the same or similar features between FIG. 25 and FIG. 20 may not be repeated, while the difference may include that in the first display mode, for the pixel units in the i$^{th}$ row and the i+1$^{th}$ row, the control unit 10 may control the control signal CKH13 outputted by the thirteenth control signal terminal 613 to be the same as the control signal CKH10 outputted by the tenth control signal terminal 610, may control the control signal CKH14 outputted by the fourteenth control signal terminal 614 to be the same as the control signal CKH11 outputted by the eleventh control signal terminal 611, and may control the control signal CKH15 outputted by the fifteenth control signal terminal 615 to be the same as the control signal CKH12 outputted by the twelfth control signal terminal 612. Therefore, the sixteenth transistor T16 and the thirteenth transistor T13 may be simultaneously turned on, the seventeenth transistor T17 and the fourteenth transistor T14 may be simultaneously turned on, and the eighteenth transistor T18 and the fifteenth transistor T15 may be simultaneously turned on. Thus, the pixel units PU in the j$^{th}$ column and the pixel units PU in the j+1$^{th}$ column may share the data signal, the driving chip of the display panel may merely need to provide the data signal corresponding to the pixel units PU in the j$^{th}$ column, thereby reducing the quantity of data signals outputted by the driving chip and reducing the power consumption of the driving chip of the display panel.

Figure 26:
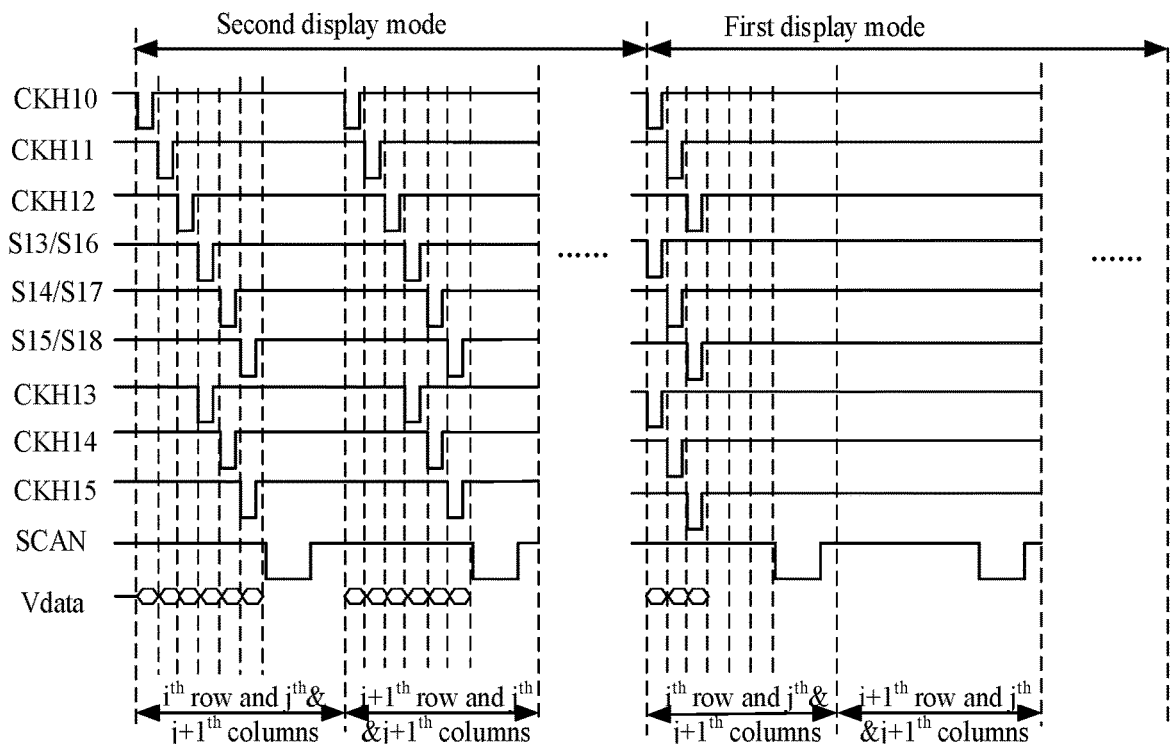
FIG. 26 illustrates another exemplary timing sequence diagram of a display panel in FIG. 17.

When the second switch unit 72 is not disposed, the purpose that not only the pixel units PU in the j$^{th}$ column and the j+1$^{th}$ column may share the data signal, but also the pixel units PU in the i$^{th}$ row and the i+1$^{th}$ row may share the data signal may be achieved. Specifically, referring to FIG. 17 and FIG. 26, the same or similar features between FIG. 26 and FIG. 21 may not be repeated, while the difference may include that in the first display mode, the control unit 10 may control the control signals CKH10, CKH11, and CKH12 corresponding to the pixel units PU in the i$^{th}$ row to be low levels in sequence, may control the control signals corresponding to the pixel units PU in the i$^{th}$ row CKH13 to be the same as CKH10, CKH14 to be the same as CKH11, and CKH15 to be the same as CKH12, and may control the control signals CKH10, CKH11, CKH12, CKH13, CKH14, and CKH15 corresponding to the pixel units PU in the i+1$^{th}$ row to be a high level.

Figure 27:
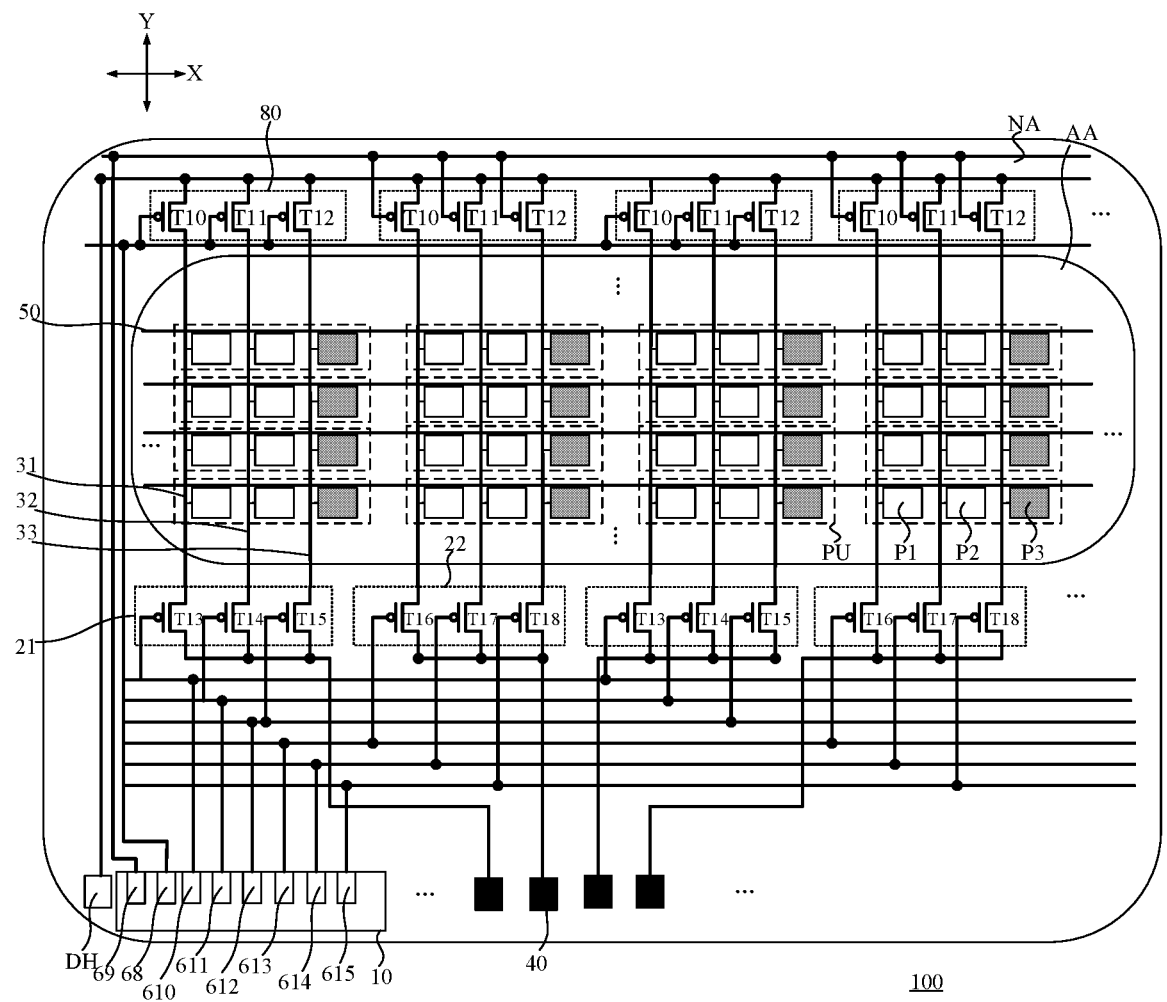
FIG. 27 illustrates a schematic top view of another exemplary display panel consistent with disclosed embodiments of the present disclosure.

In certain embodiments, referring to FIG. 27, the display panel may further include the foregoing black state control unit 80 in addition to the first multi-channel multiplexer 21 and the second multi-channel multiplexer 22.

Figure 28:
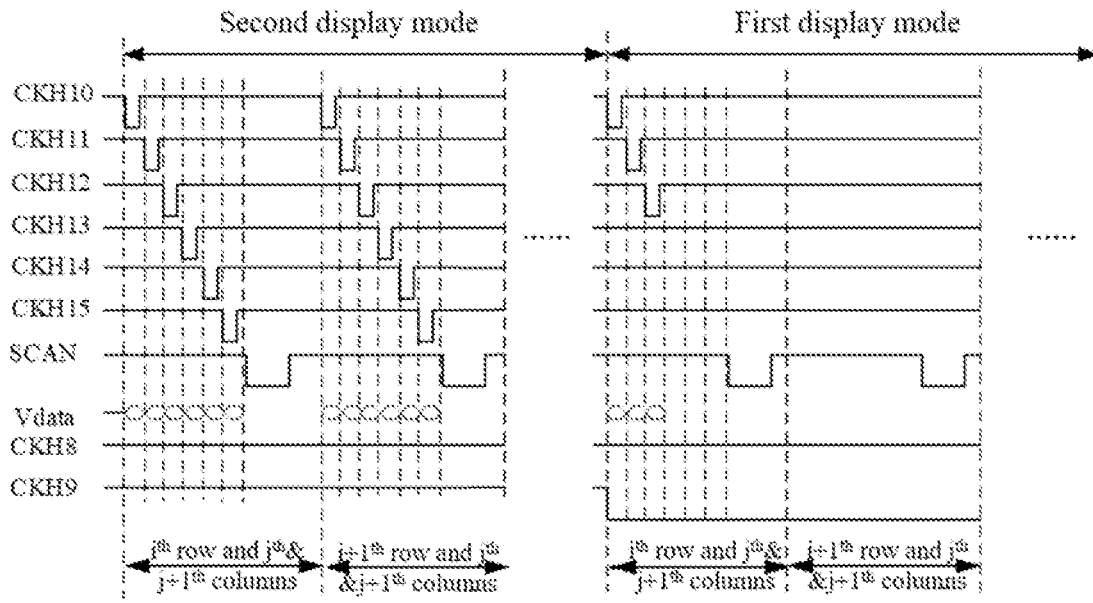
FIG. 28 illustrates an exemplary timing sequence diagram of a display panel in FIG. 27.

Referring to FIG. 28, for illustrative purposes, the black state control unit 80 corresponding to the pixel units PU in an even column may be in a turned-on state, black state control unit 80 corresponding to the pixel units PU in an odd column may be in a turned-off state, and the transistors T10-T12 may be P-type transistors as an example. The control signal outputted by the eighth control signal terminal 68 may be CKH8, and the control signal outputted by the ninth control signal terminal 69 may be CKH9. In the second display mode, the control signals CKH8 and CKH9 may be at a high-level, such that the transistors T10-T12 may be in a turned-off state. In the first display mode, the control signal CKH8 may be at a high-level, such that the transistors T10-T12 corresponding to the pixel units PU in an odd column may be in a turned-off state; the control signal CKH9 may be at a low level, such that the transistors T10-T12 corresponding to the pixel units PU in an even column may be in a turned-on state. The black state voltage outputted by the fixed voltage terminal DH may be written into the pixel units PU in an even column, and the pixel units PU in the even column may be in the black state. In addition, the control signals CKH13, CKH14, and CKH15 may be at a high-level, and the driving chip may stop outputting a data signal corresponding to the pixel units PU in the even column.

Figures 29, 30:
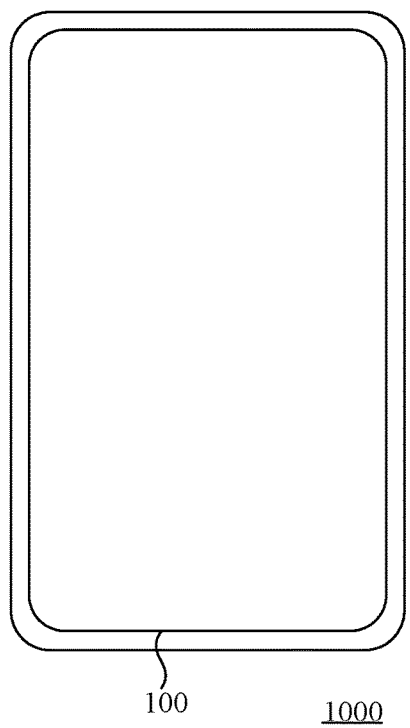
FIG. 29 illustrates a schematic flowchart of an exemplary display control method of a display panel consistent with disclosed embodiments of the present disclosure.
FIG. 30 illustrates a schematic diagram of an exemplary display device consistent with disclosed embodiments of the present disclosure.

The present disclosure also provides a display control method of a display panel, which may be configured to control a display of the display panel 100 in any of the above-disclosed embodiments. Referring to FIG. 29, the display control method of the display panel may include a step 240.

Step 240: in a first display mode, controlling sub-pixels of a same color in at least two pixel units to share a data signal, where the data signal may be a signal outputted once by a same data signal terminal of a driving chip of the display panel.

In the disclosed embodiments, because in the first display mode, the sub-pixels of the same color in at least two pixel units are controlled to share one data signal, the driving chip of the display panel may merely need to provide one data signal once for the sub-pixels sharing the data signal, which may reduce a quantity of data signals outputted by the driving chip, may reduce the power consumption of the driving chip of the display panel, thereby reducing the power consumption of the display panel.

In certain embodiments, step 240 may specifically include: in the first display mode, controlling the sub-pixels of the same color in at least two adjacent pixel units to share one data signal, and the data signal may be a data signal corresponding to any pixel unit in the at least two adjacent pixel units.

A plurality of sub-pixels of the same color sharing the data signal may display the same picture information. The sub-pixels of the same color in adjacent pixel units may be controlled to share one data signal, which may avoid the plurality of sub-pixels of the same color displaying the same picture information to be too scattered, thereby avoiding poor display quality of the display panel.

In certain embodiments, the plurality of pixel units may be distributed in M rows and N columns. Step 240 may specifically include: in the first display mode, controlling the sub-pixels of the same color of pixel units in the $i^{th}$ row and $i+1^{th}$ row of a same column to share one data signal, and the data signal may be a signal corresponding to the pixel units in the $i^{th}$ row. Further, M may be an integer and M≥2, N may be an integer and N≥2, and "I" may be an odd number and 1≤i≤M.

In one embodiment, M may be an even number. Because the sub-pixels of a same color of pixel units in an even row and previous odd row are controlled to share one data signal, the driving chip may merely need to output data signals corresponding to half of the pixel units, which may further reduce the quantity of data signals outputted by the driving chip.

In certain embodiments, step 240 may specifically include: in the first display mode, controlling sub-pixels of the same color of pixel units in the $j^{th}$ column and the $j+1^{th}$ column of the same row to share one data signal, where the data signal may be a signal corresponding to the pixel units in the $j^{th}$ column or the $j+1^{th}$ column. Further, "j" may be an odd number and 1≤j≤N.

In one embodiment, N may be an even number. Because the sub-pixels of a same color of pixel units in an even row and previous odd row are controlled to share one data signal, the driving chip may merely need to output data signals corresponding to half of the pixel units, which may further reduce the quantity of data signals outputted by the driving chip.

In certain embodiments, step 240 may specifically include: in the first display mode, controlling sub-pixels of the same color of pixel units in the $i^{th}$ row and the $i+1^{th}$ row of the same column to share one data signal, and controlling sub-pixels of the same color of pixel units in the $j^{th}$ column and the $j+1^{th}$ column of the same row to share one data signal, where the data signal may be a signal corresponding to the pixel unit in the $i^{th}$ row and the $j^{th}$ column or the pixel unit in the $i^{th}$ row and the $j+1^{th}$ column.

For example, both M and N may be an even number. Because the sub-pixels of a same color of four pixel units are controlled to share one data signal, the driving chip may merely need to output data signals corresponding to 25% of the pixel units, which may further reduce the quantity of data signals outputted by the driving chip.

The present disclosure also provides a display device, including a display panel in the present disclosure. FIG. 30 illustrates a schematic diagram of a display device consistent with disclosed embodiments of the present disclosure. Referring to FIG. 30, the display device 1000 may include a display panel 100 in any of the foregoing disclosed embodiments of the present disclosure. For illustrative purposes, the display device 1000 as a mobile phone in embodiment associated with FIG. 30 may be described in detail as an example. It should be understood that the display device in the present disclosure may be a wearable product, a computer, a TV, a vehicle-mounted display device, or any other display device with a display function, which may not be limited by the present disclosure. The display device in the present disclosure may have the beneficial effects of the display panel in the present disclosure, which may refer to specific descriptions of the display panel in the foregoing embodiments, and may not be repeated herein.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
   a display region and a non-display region;
   a plurality of pixel units, distributed in the display region in an array, wherein each pixel unit of the plurality of pixel units includes sub-pixels of at least three colors, wherein the plurality of pixel units are distributed in M rows and N columns;

a plurality of data lines, wherein in pixel units in a same column, sub-pixels of a same color are electrically connected to a same data line, and sub-pixels of different colors are electrically connected to different data lines; and a control unit, disposed in the non-display region and configured, in a first display mode, to control sub-pixels of a same color of at least two pixel units, of the plurality of pixel units, located at a same column and different rows to share a data signal.

2. The display panel according to claim 1, wherein:
the control unit is configured, in the first display mode, to control the sub-pixels of a same color in at least two adjacent pixel units of the plurality of pixel units to share a data signal.

3. The display panel according to claim 2, wherein:
the control unit is configured to:
in the first display mode, control sub-pixels of a same color of pixel units in $i^{th}$ row and $i+1^{th}$ row of a same column to share a data signal, and/or
in the first display mode, control sub-pixels of a same color of pixel units in $j^{th}$ column and $j+1^{th}$ column of a same row to share a data signal, wherein:
M is an integer greater than or equal to two, N is an integer greater than or equal to two, "i" is an odd number greater than or equal to one and less than or equal to M, and "j" is an odd number greater than or equal to one and less than or equal to N.

4. The display panel according to claim 3, wherein:
the display panel further includes a plurality of multi-channel multiplexers, and a plurality of data signal terminals, wherein:
the plurality of multi-channel multiplexers and the plurality of data signal terminals are electrically connected in a one-to-one correspondence,
each multi-channel multiplexer of the plurality of multi-channel multiplexers is electrically connected to pixel units in at least one column through a data line of the plurality of data lines, and
sub-pixels of a same color of pixel units in a same column are electrically connected to a same data line of the plurality of data lines; and the control unit is configured to:
during a first period of the first display mode, control a multi-channel multiplexer of the plurality of multi-channel multiplexers to be turned on, to transmit a data signal to sub-pixels of pixel units in $i^{th}$ row through the multi-channel multiplexer and the data line; and during a second period of the first display mode, control the multi-channel multiplexer to be turned off, to make sub-pixels of pixel units in $i+1^{th}$ row share the data signal stored on the data line in the first period, wherein the second period is after the first period, and the first period and the second period are in a same frame, and/or
in the first display mode, control multi-channel multiplexers electrically connected to pixel units in $j^{th}$ column and $j+1^{th}$ column of a same row to be simultaneously turned on, to make the pixel units in $j^{th}$ column and $j+1^{th}$ column share a data signal from a same data signal terminal of the plurality of data signal terminals.

5. The display panel according to claim 4, wherein:
the multi-channel multiplexer is electrically connected to the pixel units in $j^{th}$ column and $j+1^{th}$ column, wherein:
a pixel unit of the plurality of pixel units includes a first subpixel, a second subpixel, and a third subpixel,
the data line includes a first data line, a second data line, and a third data line, and
the first sub-pixel is connected to the first data line, the second sub-pixel is connected to the second data line, and the third sub-pixel is connected to the third data line; and
the multi-channel multiplexer includes a first transistor, a second transistor, a third transistor, a fourth transistor, a fifth transistor, and a sixth transistor, wherein:
first electrodes of the first transistor, the second transistor, the third transistor, the fourth transistor, the fifth transistor and the sixth transistor are electrically connected to a data signal terminal of the plurality of data signal terminals,
gates of the first transistor, the second transistor, the third transistor, the fourth transistor, the fifth transistor and the sixth transistor are electrically connected to a first control signal terminal, a second control signal terminal, a third control signal terminal, a fourth control signal terminal, a fifth control signal terminal and a sixth control signal terminal, respectively,
second electrodes of the first transistor, the second transistor and the third transistor are electrically connected to the first data line, the second data line and the third data line corresponding to the pixel units in $j^{th}$ column, respectively, and
second electrodes of the fourth transistor, the fifth transistor and the sixth transistor are electrically connected to the first data line, the second data line and the third data line corresponding to the pixel units in $j+1^{th}$ column, respectively.

6. The display panel according to claim 5, wherein:
the display panel further includes a first switch unit, wherein the first switch unit one-to-one corresponds to the multi-channel multiplexer, the first switch unit includes a seventh transistors, an eighth transistor and a ninth transistor, and gates of the seventh transistor, the eighth transistor and the ninth transistor are electrically connected to a seventh control signal terminal, wherein:
a first electrode of the seventh transistor is electrically connected to the first control signal terminal, and a second electrode of the seventh transistor is electrically connected to the gate of the fourth transistor,
a first electrode of the eighth transistor is electrically connected to the second control signal terminal, and a second electrode of the eighth transistor is electrically connected to the gate of the fifth transistor,
a first electrode of the ninth transistor is electrically connected to the third control signal terminal, and a second electrode of the ninth transistor is electrically connected to the gate of the sixth transistor, and
the control unit is configured, in the first display mode, to control the first control signal terminal, the second control signal terminal and the third control signal terminal to output turned-on levels in sequence, control the seventh control signal terminal to output a turned-on level, and control the fourth control signal terminal, the fifth control signal terminal and the sixth control signal terminal to stop outputting a control signal; or
a first electrode of the seventh transistor is electrically connected to the fourth control signal terminal, and a second electrode of the seventh transistor is electrically connected to the gate of the first transistor, a first electrode of the eighth transistor is electrically connected to the fifth control signal terminal, and a second electrode of the eighth transistor is electrically connected to the gate of the second transistor, a first electrode of the ninth transistor is electrically connected to the sixth control signal terminal, and a second electrode of the ninth transistor is electrically connected to the gate of the third transistor, and the control unit is configured, in the first display mode, to control the fourth control signal terminal, the fifth control signal terminal and the sixth control signal terminal to output turned-on levels in sequence, control the seventh control signal terminal to output a turned-on level, and control the first control signal terminal, the second control signal terminal and the third control signal terminal to stop outputting a control signal.

7. The display panel according to claim 5, wherein:
the control unit is configured, in the first display mode, to control the first control signal terminal, the second control signal terminal and the third control signal terminal to output turned-on levels in sequence, and to control the fourth control signal terminal, the fifth control signal terminal and the sixth control signal terminal to output same signals as the first control signal terminal, the second control signal terminal and the third control signal terminal, respectively.

8. The display panel according to claim 4, wherein:
the display panel further includes one or more black state control units, wherein the pixel units in at least one column are electrically connected to a black state control unit of the one or more black state control units through the data line; and the control unit is further configured, in the first display mode, to control at least one black state control unit of the one or more black state control units to be in a turned-on state, to make the pixel units in the at least one column electrically connected to the at least one black state control unit in the turned-on state be in a black state.

9. The display panel according to claim 8, wherein:
a quantity of the one or more black state control units is N, and each black state control unit of the one or more black state control units one-to-one corresponds to each column of the pixel units; and the control unit is configured to:
in the first display mode, control the black state control unit electrically connected to the pixel units in an odd column to be in a turned-off state, and control the black state control unit electrically connected to the pixel units in an even column to be in a turned-on state, or in the first display mode, control the black state control unit electrically connected to the pixel units in an odd column to be in a turned-on state, and control the black state control unit electrically connected to the pixel units in an even column to be in a turned-off state, or in the first display mode, control the black state control unit electrically connected to the pixel units in an odd column to be in a turned-off state, and control the black state control unit electrically connected to the pixel units in an even column to be in a turned-on state, and after an interval of N1 frames, control the black state control unit electrically connected to the pixel units in the odd column to be in the turned-on state, and control the black state control unit electrically connected to the pixel units in the even column to be in the turned-off state, wherein N1 is an integer greater than and equal to one.

10. The display panel according to claim 9, wherein:
a pixel unit of the plurality of pixel units includes a first subpixel, a second subpixel, and a third subpixel, the data line includes a first data line, a second data line, and a third data line, and the first sub-pixel is connected to the first data line, the second sub-pixel is connected to the second data line, and the third sub-pixel is connected to the third data line; and the black state control unit includes a tenth transistor, an eleventh transistor and a twelfth transistor, wherein:
first electrodes of the tenth transistor, the eleventh transistor and the twelfth transistor are electrically connected to a fixed voltage terminal, a second electrode of the tenth transistor is electrically connected to the first data line, a second electrode of the eleventh transistor is electrically connected to the second data line, and a second electrode of the twelfth transistor is electrically connected to the third data line, gates of the tenth transistor, the eleventh transistor and the twelfth transistor corresponding to the pixel units in an odd column are electrically connected to an eighth control signal terminal, and gates of the tenth transistor, the eleventh transistor and the twelfth transistor corresponding to the pixel units in an even column are electrically connected to a ninth control signal terminal.

11. The display panel according to claim 4, wherein:
the multi-channel multiplexer includes a first multi-channel multiplexer and a second multi-channel multiplexer, and the first multi-channel multiplexer is electrically connected to corresponding pixel units in $j^{th}$ column, and the second multi-channel multiplexer is electrically connected to corresponding pixel units in $j+1^{th}$ column;

a pixel unit of the plurality of pixel units includes a first subpixel, a second subpixel, and a third subpixel, the data line includes a first data line, a second data line, and a third data line, and the first sub-pixel is connected to the first data line, the second sub-pixel is connected to the second data line, and the third sub-pixel is connected to the third data line; and the first multi-channel multiplexer includes a thirteenth transistor, a fourteenth transistor and a fifteenth transistor, and the second multi-channel multiplexer includes a sixteenth transistor, a seventeenth transistor and an eighteenth transistor, wherein:
first electrodes of the thirteenth transistor, the fourteenth transistor and the fifteenth transistor are electrically connected to one data signal terminal of the plurality of data signal terminals, first electrodes of the sixteenth transistor, the seventeenth transistor and the eighteenth transistor are electrically connected to another data signal terminal of the plurality of data signal terminals, second electrodes of the thirteenth transistor, the fourteenth transistor and the fifteenth transistor are electrically connected to the first data line, the second data line and the third data line corresponding to the pixel units in $j^{th}$ column, respectively, second electrodes of the sixteenth transistor, the seventeenth transistor and the eighteenth transistor are electrically connected to the first data line, the second data line, and the third data line corresponding to the pixel units in $j+1^{th}$ column, respectively, and gates of the thirteenth transistor, the fourteenth transistor, the fifteenth transistor, the sixteenth transistor, the seventeenth transistor, and the eighteenth transistor are electrically connected to a tenth control signal terminal, an eleventh control signal terminal, a twelfth control signal terminal, a thirteenth control signal terminal, a fourteenth control signal terminal, and a fifteenth control signal terminal, respectively.

12. The display panel according to claim 11, wherein:
the display panel further includes a second switch unit, including a nineteenth transistor, a twentieth transistor and a twenty-first transistor, and gates of the nineteenth transistor, the twentieth transistor and the twenty-first transistor are electrically connected to a sixteenth control signal terminal, wherein:
  a first electrode of the nineteenth transistor is electrically connected to the tenth control signal terminal, and a second electrode of the nineteenth transistor is electrically connected to the first electrode of the sixteenth transistor,
  a first electrode of the twentieth transistor is electrically connected to the eleventh control signal terminal, and a second electrode of the twentieth transistor is electrically connected to the first electrode of the seventeenth transistor,
  a first electrode of the twenty-first transistor is electrically connected to the twelfth control signal terminal, and a second electrode of the twenty-first transistor is electrically connected to the first electrode of the eighteenth transistor, and
  the control unit is configured, in the first display mode, to control the tenth control signal terminal, the eleventh control signal terminal and the twelfth control signal terminal to output turned-on levels in sequence, control the sixteenth control signal terminal to output a turned-on level, and control the thirteenth control signal terminal, the fourteenth control signal terminal and the fifteenth control signal terminal to stop outputting a control signal; or
  a first electrode of the nineteenth transistor is electrically connected to the thirteenth control signal terminal, and a second electrode of the nineteenth transistor is electrically connected to the first electrode of the thirteenth transistor,
  a first electrode of the twentieth transistor is electrically connected to the fourteenth control signal terminal, and a second electrode of the twentieth transistor is electrically connected to the first electrode of the fourteenth transistor,
  a first electrode of the twenty-first transistor is electrically connected to the fifteenth control signal terminal, and a second electrode of the twenty-first transistor is electrically connected to the first electrode of the fifteenth transistor, and
  the control unit is configured, in the first display mode, to control the thirteenth control signal terminal, the fourteenth control signal terminal and the fifteenth control signal terminal to output turned-on levels in sequence, control the sixteenth control signal terminal to output a turned-on level, and control the tenth control signal terminal, the eleventh control signal terminal and the twelfth control signal terminal to stop outputting a control signal.

13. A display control method of a display panel, configured to control a display of the display panel, comprising:
  providing the display panel including a plurality of pixel units, wherein each pixel unit of the plurality of pixel units includes sub-pixels of at least three colors, wherein the plurality of pixel units are distributed in M rows and N columns, and the display panel further includes a plurality of data lines, wherein in pixel units in a same column, sub-pixels of a same color are electrically connected to a same data line, and sub-pixels of different colors are electrically connected to different data lines; and
  in a first display mode, controlling sub-pixels of a same color of at least two pixel units, of the plurality of pixel units, located at a same column and different rows to share a data signal, wherein the data signal is a signal outputted once by a same data signal terminal of a driving chip of the display panel.

14. The display control method according to claim 13, wherein:
  in the first display mode, controlling sub-pixels of the same color of the at least two pixel units to share the data signal includes:
    in the first display mode, controlling sub-pixels of the same color of pixel units in $i^{th}$ h row and $i+1^{th}$ row of a same column to share the data signal, wherein the data signal is a signal corresponding to the pixel units in one of the $i^{th}$ row and the $i+1^{th}$ row, and/or
    in the first display mode, controlling sub-pixels of the same color of pixel units in $j^{th}$ column and $j+1^{th}$ column of a same row to share the data signal, wherein the data signal is a signal corresponding to the pixel units in one of the $j^{th}$ column and the $j+1^{th}$ column, wherein:
      M is an integer greater than or equal to two, N is an integer greater than or equal to two, "i" is an odd number greater than or equal to one and less than or equal to M, and "j" is an odd number greater than or equal to one and less than or equal to N.

15. A display device, comprising:
  a display panel, wherein the display panel includes:
    a display region and a non-display region;
    a plurality of pixel units, distributed in the display region in an array, wherein each pixel unit of the plurality of pixel units includes sub-pixels of at least three colors, wherein the plurality of pixel units are distributed in M rows and N columns;
    a plurality of data lines, wherein in pixel units in a same column, sub-pixels of a same color are electrically connected to a same data line, and sub-pixels of different colors are electrically connected to different data lines; and
    a control unit, disposed in the non-display region and configured, in a first display mode, to control sub-pixels of a same color of at least two pixel units, of the plurality of pixel units, located at a same column and different rows to share a data signal.

* * * * *